(12) United States Patent
Youn et al.

(10) Patent No.: US 7,972,902 B2
(45) Date of Patent: Jul. 5, 2011

(54) METHOD OF MANUFACTURING A WAFER INCLUDING PROVIDING ELECTRICAL CONDUCTORS ISOLATED FROM CIRCUITRY

(75) Inventors: Sunpil Youn, Seoul (KR); Seok-Chan Lee, Seoul (KR)

(73) Assignee: Samsung Electronics Co., Ltd., Maetan-dong, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 12/575,586

(22) Filed: Oct. 8, 2009

(65) Prior Publication Data
US 2010/0019397 A1      Jan. 28, 2010

Related U.S. Application Data

(63) Continuation-in-part of application No. 12/032,430, filed on Feb. 15, 2008, now Pat. No. 7,888,806.

(51) Int. Cl.
*H01L 21/44* (2006.01)

(52) U.S. Cl. ........ 438/107; 438/113; 438/460; 257/784; 257/E21.499; 257/E21.599

(58) Field of Classification Search .................. 438/107, 438/113, 460; 257/784, E21.499, E21.599
See application file for complete search history.

(56) References Cited

U.S. PATENT DOCUMENTS

| | | | |
|---|---|---|---|
| 5,364,009 A | 11/1994 | Takahashi et al. | |
| 5,870,289 A * | 2/1999 | Tokuda et al. | 361/779 |
| 6,958,532 B1 | 10/2005 | Nakayama et al. | |
| 6,979,905 B2 | 12/2005 | Nishida et al. | |
| 7,105,930 B2 | 9/2006 | Lua et al. | |
| 7,298,033 B2 | 11/2007 | Yoo | |
| 7,453,159 B2 | 11/2008 | Song et al. | |
| 7,585,750 B2 * | 9/2009 | Do et al. | 438/462 |
| 7,648,911 B2 * | 1/2010 | Pagaila et al. | 438/667 |
| 2003/0022465 A1 * | 1/2003 | Wachtler | 438/462 |
| 2004/0229398 A1 * | 11/2004 | Magerlein et al. | 438/106 |
| 2005/0200003 A1 | 9/2005 | Yoon et al. | |
| 2006/0091560 A1 | 5/2006 | Kang et al. | |
| 2006/0172465 A1 | 8/2006 | Brennan et al. | |
| 2008/0272465 A1 * | 11/2008 | Do et al. | 257/620 |

FOREIGN PATENT DOCUMENTS

| | | | |
|---|---|---|---|
| JP | 58222553 A | * | 12/1983 |
| JP | 2004-047715 A | | 2/2004 |
| KR | 2000-0027519 A | | 5/2000 |
| KR | 2001-0062929 A | | 7/2001 |

* cited by examiner

*Primary Examiner* — Andy Huynh

(74) *Attorney, Agent, or Firm* — Muir Patent Consulting, PLLC

(57) ABSTRACT

Conductive lines are formed on a wafer containing multiple circuits. The conductive lines are isolated from the circuits formed within the wafer. Chips are mounted on the wafer and have their chip pads connected to the conductive lines of the wafer. The wafer may then be protected with a packaging resin and singulated.

27 Claims, 32 Drawing Sheets

METHOD OF MANUFACTURING A WAFER INCLUDING PROVIDING ELECTRICAL CONDUCTORS ISOLATED FROM CIRCUITRY

CROSS REFERENCE TO RELATED APPLICATION

This U.S. utility patent application is a continuation-in-part of U.S. utility patent application Ser. No. 12/032,430 filed Feb. 15, 2008 now U.S. Pat. No. 7,888,806, which claims priority from Korean patent application 2007-0073476 filed Jul. 23, 2007, the subject matter of each of which is incorporated herein by reference in its entirety.

TECHNICAL FIELD OF THE DISCLOSURE

The technical field of this disclosure relates generally to the art of semiconductor devices; and more particularly to the art of electrical connections in modules having multiple semiconductor chips.

BACKGROUND OF THE DISCLOSURE

As electronic products move to smaller size, higher density and performance, semiconductors have correspondingly become smaller with their components and connections becoming denser. This in turn has lead to the development of multichip packages (MCPs) in which a plurality of semiconductor chips are stacked on a substrate such as a printed circuit board. This creates a high density, high performance package that is nonetheless small in size.

As density increases and size decreases, however, problems may develop with multichip modules. For example, in FIG. 1, an MCP includes a first semiconductor chip 10 mounted on a substrate 12. A second semiconductor chip 14 is mounted on semiconductor chip 10 thereby forming an MCP comprising semiconductor chips 10, 14. Chip 10, which is larger than chip 14, includes terminals such as terminals 16, 18. Chip 14 also includes terminals, like terminals 20, 22. As can be seen, the terminals on chip 14 are spaced much more closely together than those on chip 10. The terminals on both chips are electrically connected to conductive pads, like pads 24, 26, formed on substrate 12 via wire bonds, such as wire bonds 28, 30. When electrically connected to the pads on the substrate of the MCP, the terminals of the upper chip are often further away and higher from the substrate than those of the lower chip. As a consequence, the electrical connections (e.g. wire bonds) connecting the terminals of the upper chip to the substrate pads of the MCP are often longer; and form greater angles relative to the substrate than those connecting the terminals of the lower chip to the substrate pads. Moreover, the terminals on the upper chip are often deployed much closer together. All the above factors may combine to produce wire sweeping, in which the wire bonds connecting the terminals of the upper chip can electrically short against one another. Furthermore, the longer each wire bond, the more likely the wire will be broken during manufacturing, e.g., when the wires are encapsulated.

In addition to these problems, when the terminals are close together as on chip 14, there is a limit to how many adjacent terminals can be wire bonded to the substrate. As seen in FIG. 1, there is a gap indicated generally at 31 that must be included because the density and length of the bonds limit the number of adjacent wire bond connections.

Therefore, it is desired to provide electrical connections in MCPs.

SUMMARY

In one example, a method of manufacturing is disclosed, the method comprising: providing a semiconductor substrate; forming circuitry in a first die area of the semiconductor substrate substantially consisting of a first circuit and circuitry in a second die area of the semiconductor substrate substantially consisting of a second circuit; forming first pads in electrical communication with the first circuit and second pads in electrical communication with the second circuit; forming conductive lines within the boundaries of the first and second die areas, the conductive lines substantially electrically isolated from the first and second circuits; and after forming the conductive lines, separating the first die area from the second die area to form first and second semiconductor chips respectively corresponding to the first and second die areas.

In another example, a wafer is disclosed, the wafer comprising: circuitry provided in a first die area substantially consisting of a first circuit; circuitry provided in a second die area substantially consisting of a second circuit; conductors extending across the first and second die areas, having no electrical connections with the first and second circuits.

In yet another example, a method of manufacturing is disclosed, the method comprising: providing a wafer comprising a substrate, a first circuit formed at least one of on and within the substrate, and first conductors substantially electrically isolated from the first circuit; and singulating at least a first chip from the wafer, the first chip comprising circuitry and at least a portion of the first conductors, the circuitry of the first chip substantially consisting of the first circuit.

In yet another example, a method of manufacturing is disclosed, the method comprising: combining a first chip with a second chip in a multi-chip package; and electrically connecting a pad of the second chip to a first conductor of the first chip, and electrically connecting the first conductor to a terminal of the multi-chip package, wherein within the first chip, there are no power or signal connections between the first conductor and all internal circuitry of the first chip.

In yet another example, a method is disclosed, the method comprising: providing a semiconductor device wafer having a plurality of die areas; forming a plurality of circuits in the die areas of the device wafer; forming a dielectric layer on the circuits and the device wafer; forming a plurality of chip pads on the dielectric layer and in the die areas, wherein the chip pads in a die area are connected to the circuit located in said die area; forming a passivation layer, comprising: depositing a passivation layer on the dielectric layer and the chip pads; and patterning the passivation layer such that, in a die area, at least a portion of a chip pad of said die area is exposed; forming a plurality of conductive lines on the passivation layer such that the conductive lines in each die area are isolated from the circuit located in said each die area; and separating the die areas from the device wafer so as to obtain individual semiconductor devices after forming the conductive lines.

In yet other examples, devices formed by one or more of the above methods are disclosed.

BRIEF DESCRIPTION OF DRAWINGS

FIG. 22a, FIG. 22b, FIG. 22c, FIG. 22d and FIG. 22e are cross-sectional views of the MCP portions in FIG. 21; wherein: FIG. 22a is a cross-sectional view of the MCP portions along the AA' line in FIG. 21; FIG. 22b is a cross-sectional view of the MCP portions along the BB' line in FIG. 21; FIG. 22c shows another exemplary insulating layer on the backside of the semiconductor substrate, and FIGS. 22d and 22e show exemplary additional modification of FIGS. 22b and 22c;

FIG. 23a and FIG. 23b demonstrate another exemplary electrical connection scheme in MCPs on a wafer before singulation, wherein: FIG. 23a is a cross-sectional view of the MCP portions taken along the AA' line in FIG. 21; and FIG. 23b is a cross-sectional view of the MCP portions along the BB' line in FIG. 21;

DETAILED DESCRIPTION OF SELECTED EXAMPLES

Disclosed in the following is a semiconductor package including a first semiconductor chip mounted on a substrate and a second semiconductor chip mounted on top of the first semiconductor chip. A plurality of metal lines is deposited on the top of the first chip, and the metal lines are isolated from circuitry in the first chip. Wire bonds connect pads on the second chip to metal lines on the first chip. Additional wired bonds connect the metal lines on the first chip to terminals on the substrate. Conductive through-silicon vias or solder bumps may replace the wire bonds, and additional chips may be included in the package Further disclosed in the following is a connection scheme for use in electrically connecting semiconductor chips in MCPs; and in particular, a connection scheme that electrically connects semiconductor chips of MCPs on a wafer before singulation. The electrical connections of the semiconductor chips can be on a wafer during a chip making level wherein the semiconductor chips are being fabricated, or can be on a packaging level wherein the fabricated semiconductor chips are being packaged.

The electrical connection scheme and the methods of fabricating the electrical connections will be discussed in the following with selected examples. However, it will be appreciated by those skilled in the art that the following discussion is for demonstration purposes; and should not be interpreted as a limitation. Other variations within the scope of this disclosure are also applicable. For example, examples of this disclosure are also applicable to other devices or structures, especially electronic devices and structures fabricated by standard or current semiconductor fabrication processes, such as micro-structures (e.g. microelectromechanical devices and interconnections).

Turning to the drawings, FIGS. 2-8 illustrate a variety of semiconductor chips that may be placed on top of another chip in an MCP. FIGS. 9-18 illustrate semiconductor chips, including chips like those depicted in FIGS. 2-8, in MCPs.

Figure 1:
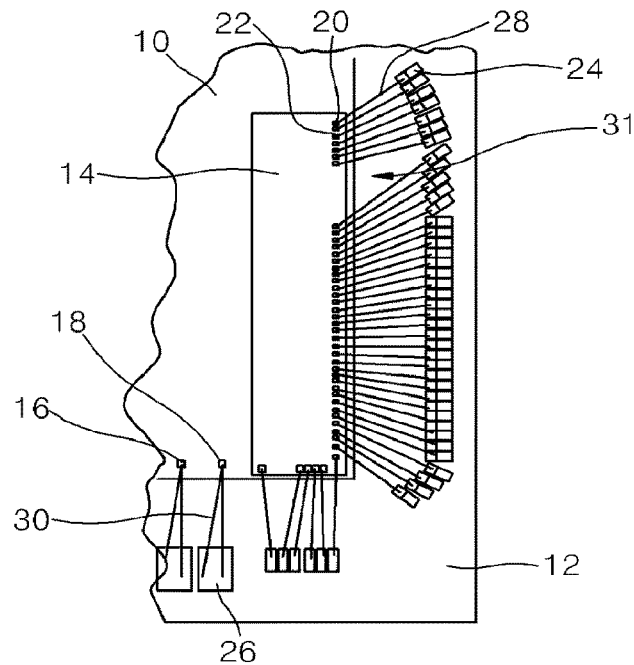
FIG. 1 is an enlarged partial view of a prior art MCP.
Figure 2:
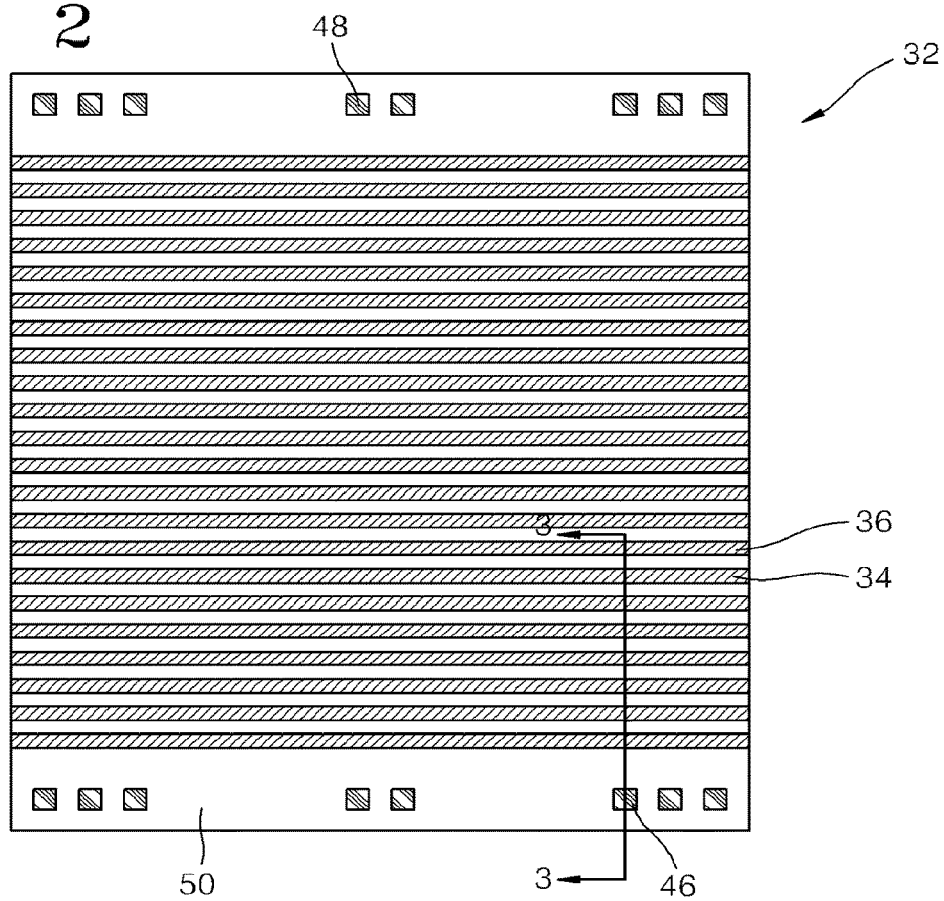
FIG. 2 is a top plan view of a semiconductor chip constructed in accordance with an example.
Figure 3:
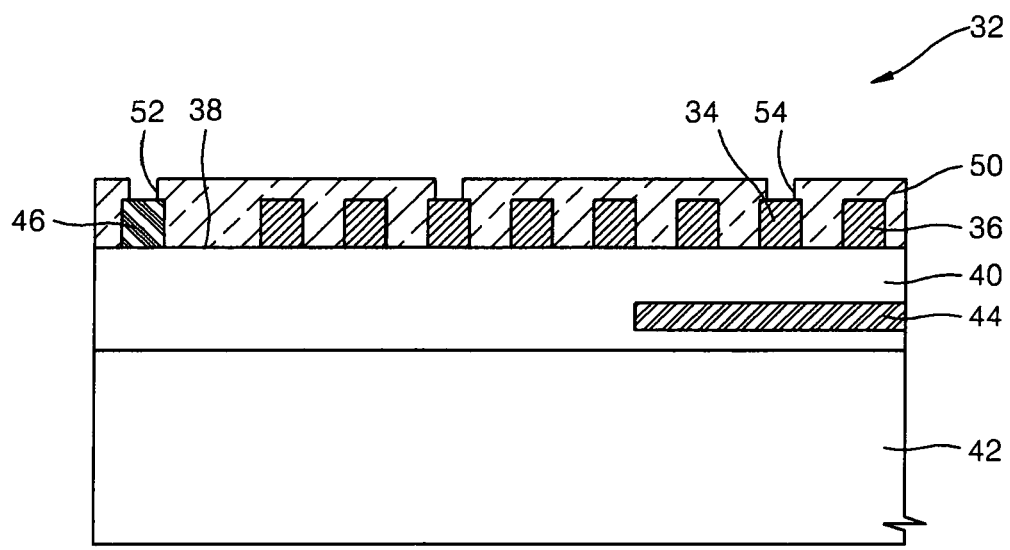
FIG. 3 is an enlarged cross sectional view taken along line 3-3 in FIG. 2.

With reference first to FIGS. 2 and 3, indicated generally at 32 is a semiconductor device. Device 32 includes a plurality of conductive lines, like conductive lines 34, 36. The conductive lines are formed on the surface 38 of a dielectric layer 40, which in turn is formed on a semiconductor substrate 42. The conductive lines can form a pattern of alternating lines and spaces, as shown. An internal circuit region 44 is formed in dielectric layer 40. Conductive chip pads, like pads 46, 48, are formed on dielectric layer 40 and connect to internal circuit portions (not depicted) of semiconductor device 32. A passivation layer 50 is formed on dielectric layer 40.

Openings, like openings 52, 54, are formed in passivation layer 50 with opening 52 exposing a portion of chip pad 46 and opening 54 exposing a portion of conductive line 34. Each of the chip pads, like chip pads 46, 48, include a corresponding opening to expose the chip pads for connection to external circuitry. Additional openings, like opening 54, are formed over at least some of the metal lines in a manner that will be described more fully herein.

The chip pads, like chip pads 46, 48, may be formed in the same process step, or in a different step, as formation of the conductive lines, like lines 34, 36. The conductive lines are electrically isolated from the chip pads. Conductive lines that provide power or ground connections in an MCP may be wider than other conductive lines.

Figure 4:
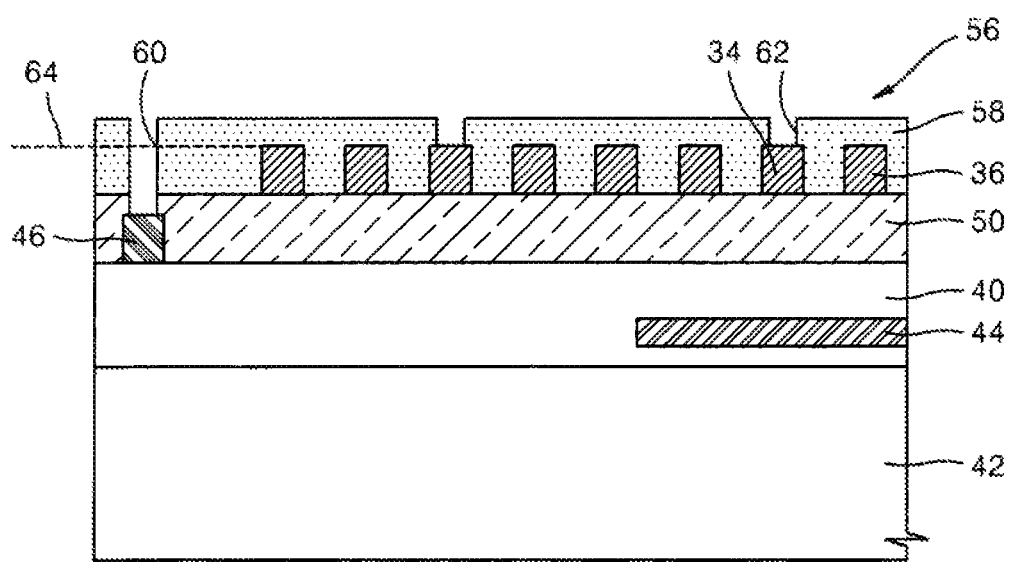
FIG. 4 is a second example depicted in a view similar to FIG. 3.

In FIG. 4, indicated generally at 56 is another exemplary semiconductor chip. Structure that corresponds to previously identified structure is either unnumbered or carries the same identifying number. In chip 56, the conductive lines, like conductive lines 34, 36, are formed on top of passivation layer 50 rather than on top of dielectric layer 40 as in FIG. 3. A resin layer 58 is formed on top of passivation layer 50 and includes openings, like openings 60, 62, to expose the chip pads and parts of the conductive lines in the same manner as openings 52, 54 in FIG. 3. Resin layer 58 comprises a polymer layer including polyimide.

In chip 56, the chip pads and conductive lines can be formed in different planes and in different process steps. To increase wire bonding efficiency and to prevent difficulties during wire bonding caused by the difference in height between the chip pads and the conductive lines, the height of the chip pads, like chip pad 46, may be extended in a further process step to the level of dashed line 64 thereby brining the upper surfaces of both the conductive lines and the chip pads to substantially the same plane.

The extension of the chip pads, like chip pad 46, to the level of dashed line 64 may be accomplished in the same process step in which the conductive lines are formed thereby bringing the upper surfaces of both the conductive lines and the chip pads to substantially the same plane. For example, after the formation of the opening 52 as shown in FIG. 3, a blanket conductive layer (not shown) can be formed on passivation layer 50 and chip pad 46. The conductive lines and an extended portion (not shown) of chip pad 46 can be formed by a conventional patterning process of the blanket conductive layer. The resin layer 58 is formed on top of passivation layer 50 and includes the openings, like opening 62 and upper portion of opening 60, to expose the extended portion of the chip pads and parts of the conductive lines in the same manner as openings 52, 54 in FIG. 3.

Figure 5:
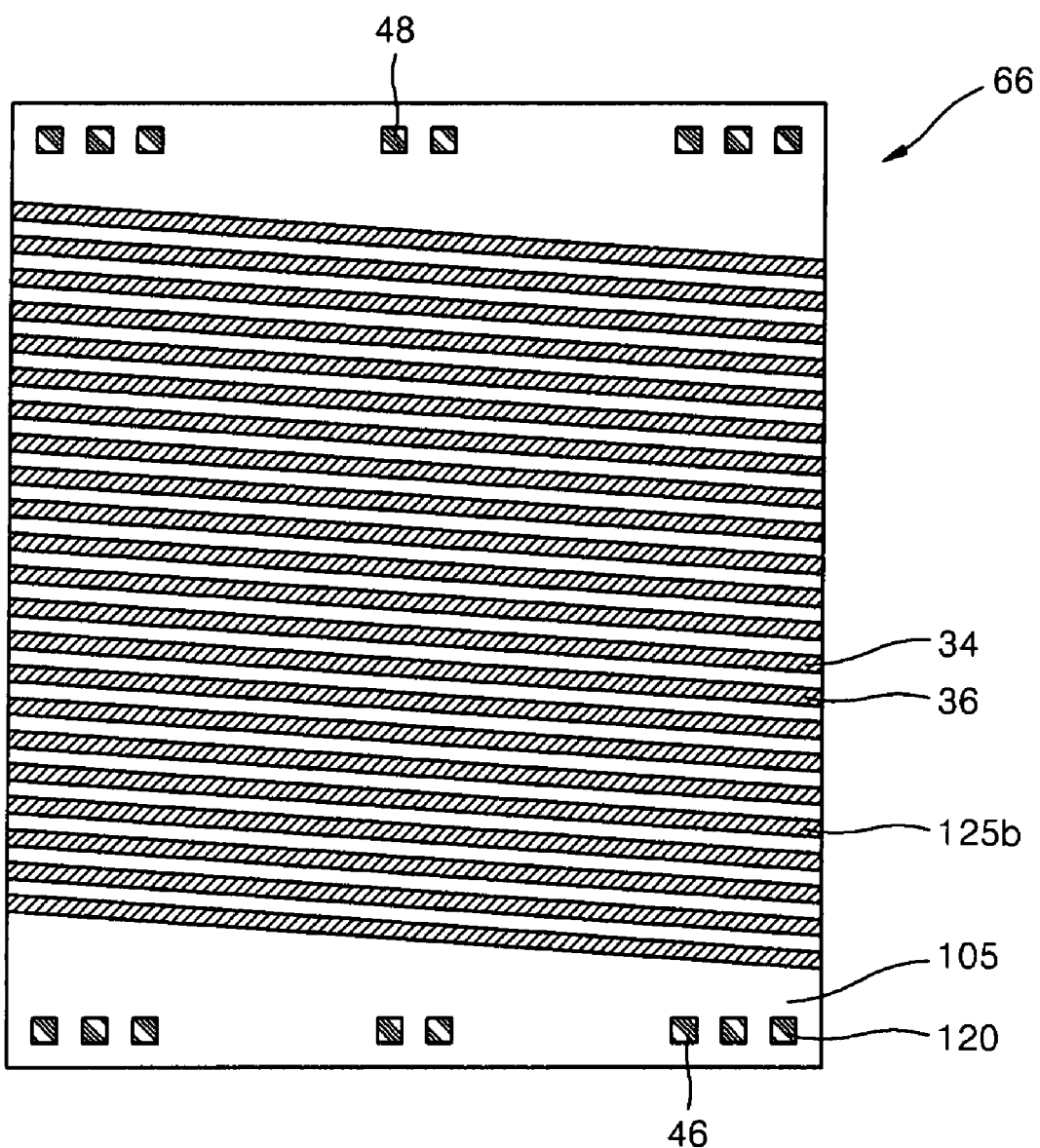
FIG. 5 is a top plan view of a third example.

In FIG. 5, indicated generally at 66 is another exemplary semiconductor chip. Structure that corresponds to previously identified structure is either unnumbered or carries the same identifying number. In chip 66, the conductive lines, like conductive lines 34, 36, are at an angle relative to the generally rectangular shape of chip 66. Lines 34, 36 may be placed at any angle, and may not even necessarily be linear—for example, one or more lines could be curved—so long as the lines are electrically isolated from the chip pads, like pads 46, 48.

Figure 6:
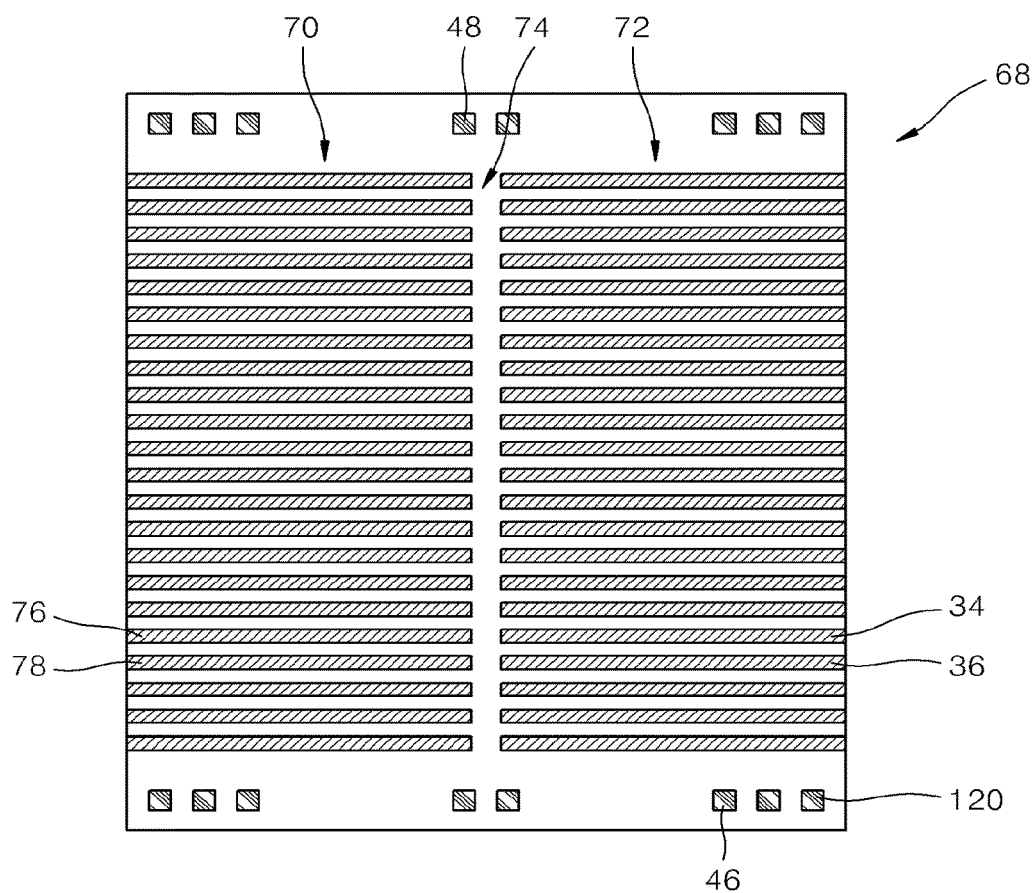
FIG. 6 is a top plan view of a fourth example.

In FIG. 6, indicated generally at 68 is another exemplary semiconductor chip. Structure that corresponds to previously identified structure is either unnumbered or carries the same identifying number. In chip 56, the conductive lines, like conductive lines 34, 36, are separated into two groups 70, 72, with the groups being separated by a space indicated generally at 74. As a result, lines 34, 36 are electrically isolated from collinear lines 76, 78, respectively. As will be seen, this permits lines in each group, like lines 34, 36, to propagate different signals because they are electrically isolated from one another.

Figure 7:
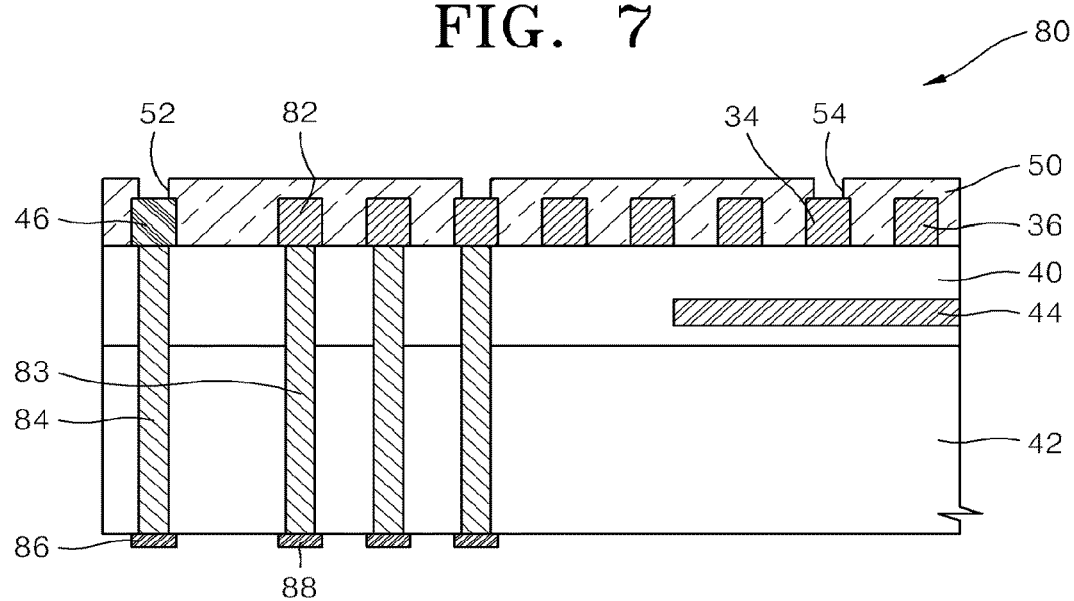
FIG. 7 is a fifth example depicted in a view similar to FIGS. 3 and 4.

In FIG. 7, indicated generally at 80 is another exemplary semiconductor chip. Structure that corresponds to previously identified structure is either unnumbered or carries the same identifying number. In chip 80, at least one of conductive lines, like 82, and chip pad 46 are each connected to a conductive through-silicon via (TSV) 83, 84, respectively, as are several other of the conductive lines and chip pads, although the chip pad connections are not visible in FIG. 7. Each conductive TSV is connected to a conductive pad, like pads 86, 88.

The TSVs are each formed through dielectric layer 40 and semiconductor substrate 42 and thereby carry signals from the metal lines and chip pads to the conductive pads, like pads 86, 88, on the underside of semiconductor chip 80. As will be seen, this arrangement facilitates connections in an MCP. This approach could also be used in the embodiment of FIG. 4.

Figure 8:
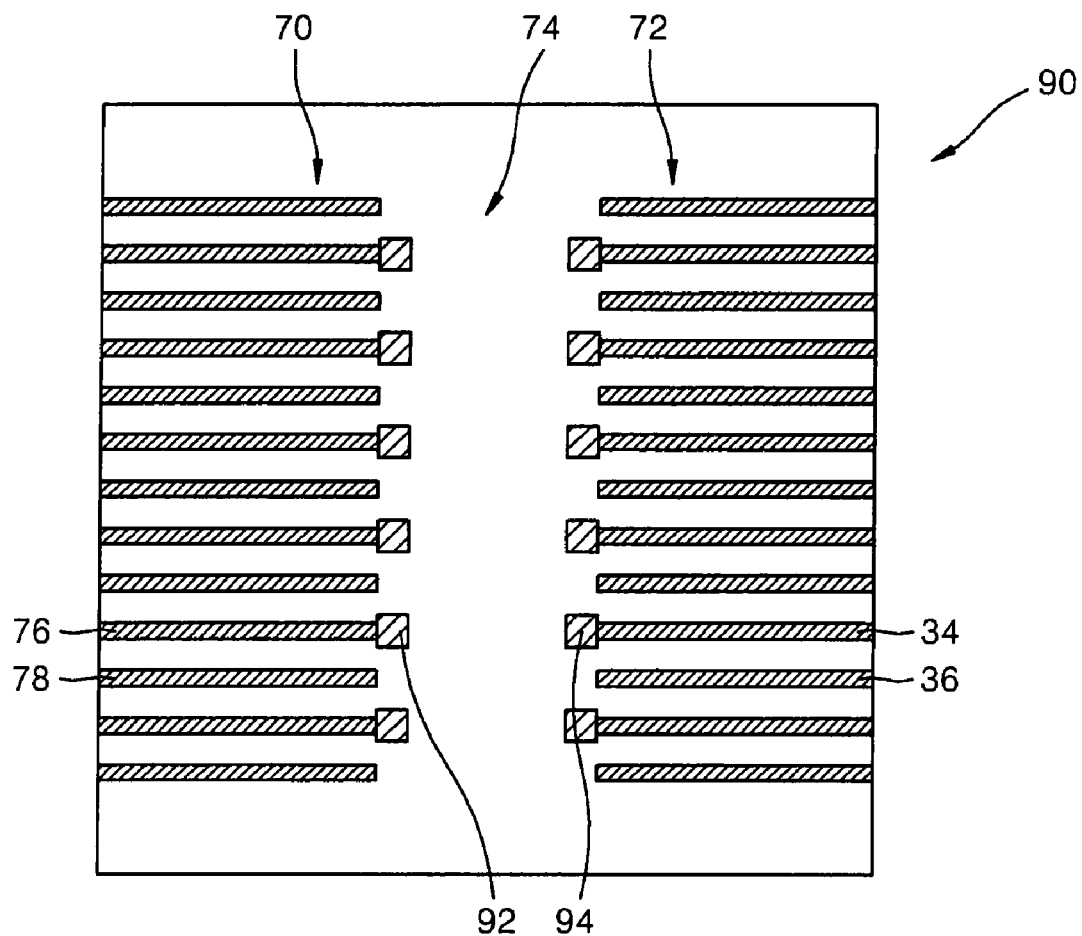
FIG. 8 is a top plan view of a sixth example.

In FIG. 8, indicated generally at 90 is another exemplary semiconductor chip. Structure that corresponds to previously identified structure is either unnumbered or carries the same identifying number. Semiconductor chip 90 has conductive lines laid out in a manner similar to semiconductor chip 68 in FIG. 6. Chip 90, however, includes center chip pads, like chip pads 92, 94. As the chip pads in the other embodiments do, the chip pads in chip 90 make electrical connections with circuitry internal to chip 90. Unlike the other embodiments, however, each of the chip pads on chip 90 are electrically connected to a single corresponding conductive line, like chip pads 92, 94 are connected to lines 76, 34, respectively. As can be seen, there are additional conductive lines that are not connected to chip pads. These additional unconnected lines are electrically isolated from the internal chip circuitry and from the chip pads. This arrangement provides for redistribution of the signals on the chip pads via the conductive line to which each pad is connected, as will be further described in connection with FIG. 18.

Figure 9:
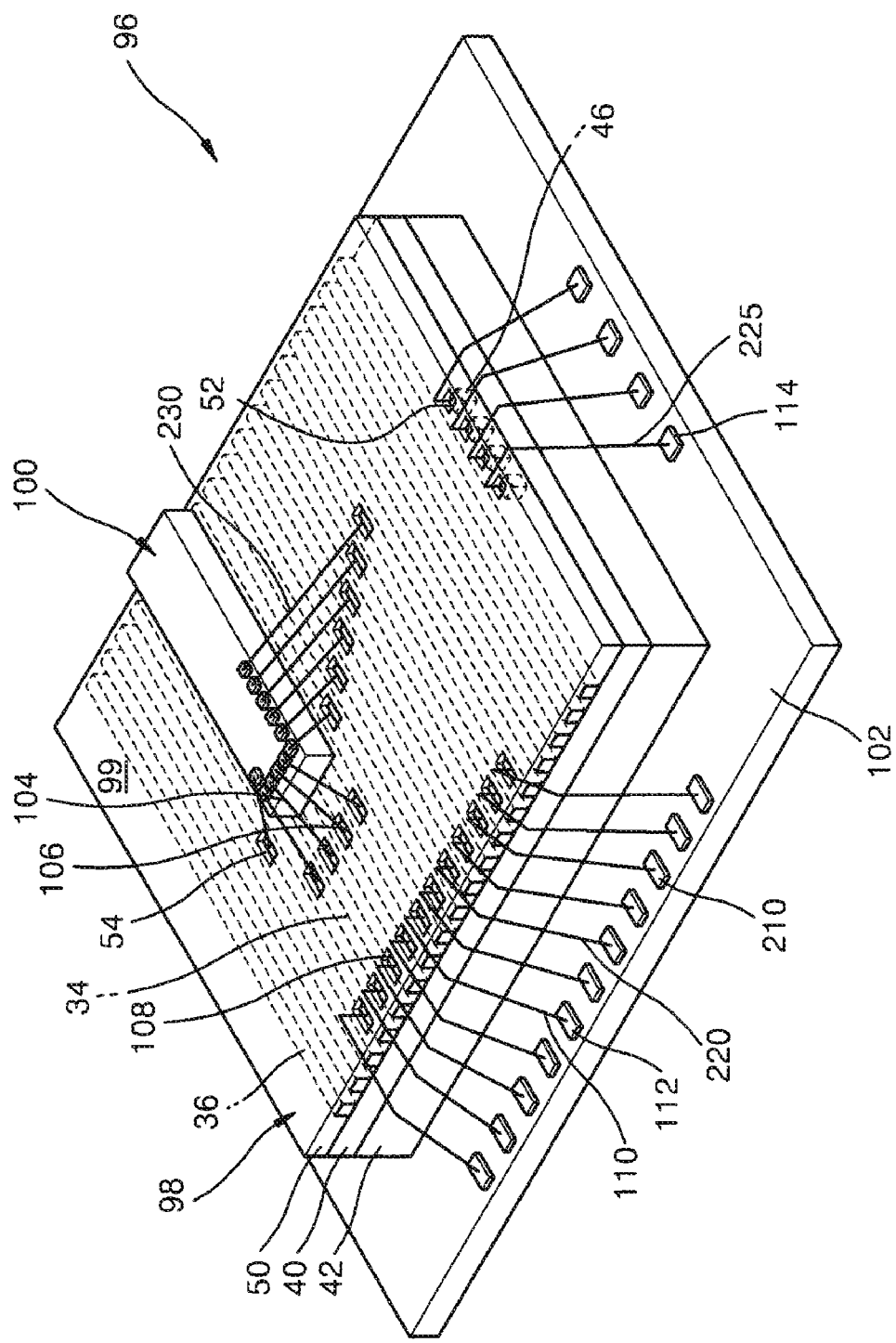
FIG. 9 is a perspective, somewhat schematic view of a first MCP constructed in accordance with an example.

Indicated generally at 96 in FIG. 9 is an MCP. The MCP includes a first semiconductor chip 98 and a second semiconductor chip 100. Structure that corresponds to previously identified structure is either unnumbered or carries the same identifying number. Chip 98 is constructed similarly to chip 32 in FIGS. 2 and 3. Chip 100 is mounted on chip 98 via adhesive, and chip 98 is mounted on a substrate 102, also using adhesive. A first side (not visible) of chip 98 is mounted on substrate 102. Chip 100 is mounted on the second side 99 of chip 98.

Chip 100 includes conductive pads as shown that are connected via wire bonds, like wire bond 104, to conductive line 34. A portion of conductive line 34 is exposed by an opening 106 etched into passivation layer 50 in the manner shown in FIG. 3. This permits wire bond 104 to be electrically connected to the conductive line by a bonding process. As a result, internal circuitry of chip 100 is electrically connected to conductive line 34 via a chip pad on chip 100 and wire bond 104. This redistributes the connection point for the internal circuitry of chip 100.

Another opening 108 over conductive line 34 provides access to the conductive line for bonding one end of another wire 110 to conductive line 34. The other end of wire 110 is bonded to a terminal 112 on substrate 102. Other terminals on chip 100 are bonded to other conductive lines via wire bonds, like wire bond 104, as shown, and these other conductive lines are in turn bonded to terminals, like terminal 112 on substrate 102, via wire bonds like wire bond 110. In this manner, the connections to circuitry in chip 100 are redistributed to facilitate wire bonding in a manner that obviates problems associated with the length, height, and bonding angles of the conventional approach. Chip pads, or terminals, on first semiconductor chip 98 are connected to terminals, like terminal 114 on substrate 102, via wire bonds like wire bond 225. The terminals such as terminal 114 are also referred to herein as electrical contacts.

This approach provides for electrically connecting chip 100 and substrate 102 with wire bonds that have a length, height, and bonding angle similar to the wire bonds that connect the pads on chip 98 to the substrate.

Figure 10:
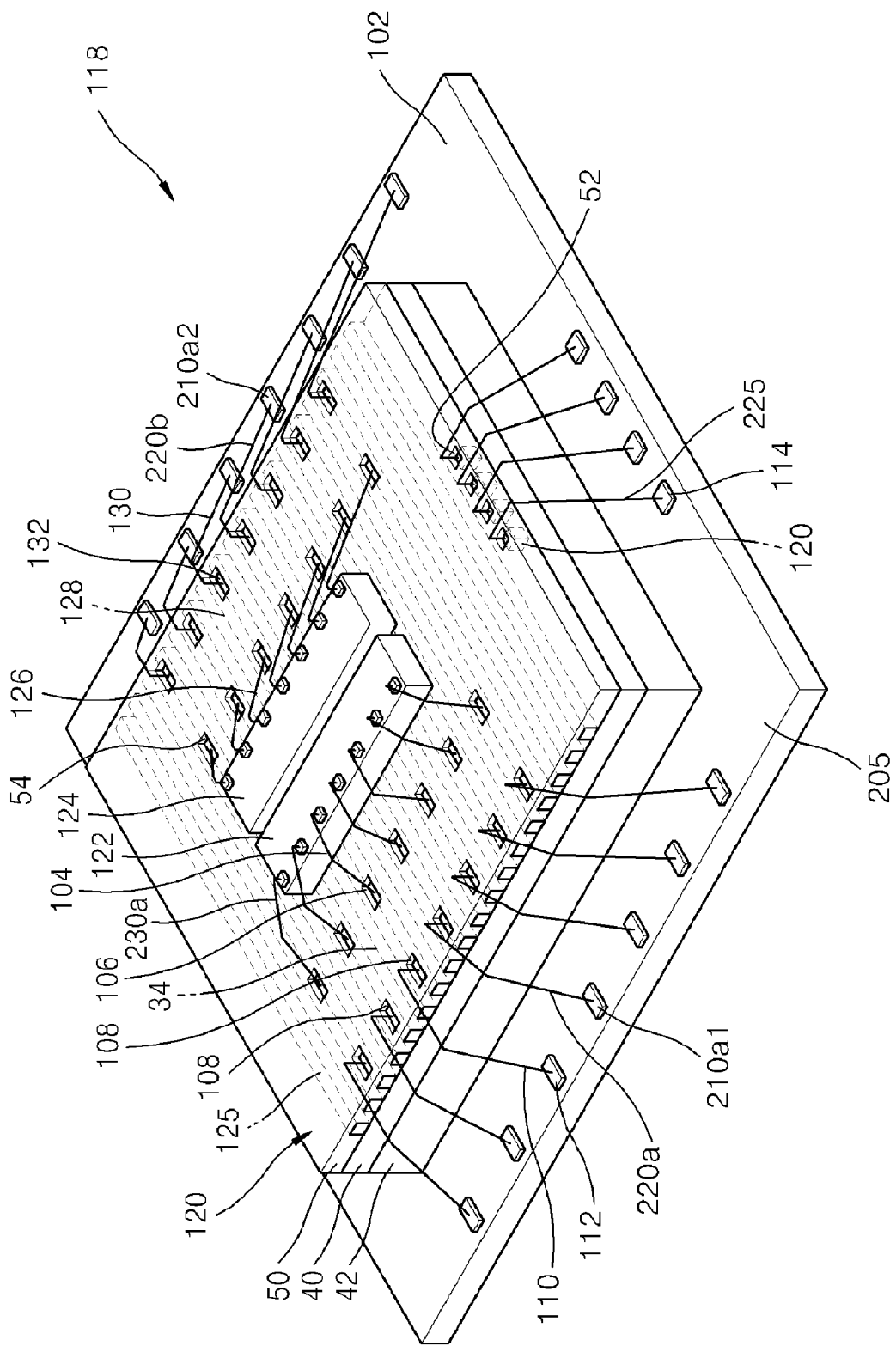
FIG. 10 is a perspective, somewhat schematic view of a second MCP constructed in accordance with an example.

Indicated generally at 118 in FIG. 10 is an MCP. The MCP includes a first semiconductor chip 120, a second semiconductor chip 122, and a third semiconductor chip 124. Structure that corresponds to previously identified structure is either unnumbered or carries the same identifying number. Chip 120 is constructed similarly to chip 98 in FIG. 9. And chips 122, 124 are mounted on chip 120 similarly to the way chip 100 is mounted on chip 98 in FIG. 9.

Chip 124 includes pads that are connected to metal lines in a manner similar to how the pads on chip 122 are connected to metal lines. For example, on chip 122 a wire bond 126 connects one of the pads on chip 122 to a conductive line 128. Another wire bond 130 is connected to conductive line 128 through an etched opening 132. The other end of wire bond 130 is connected to one of the terminals on substrate 102.

Because each conductive line is isolated from every other conductive line, and from internal semiconductor circuitry, adjacent conductive lines, like lines 34, 128, may be used to route connections from the pads on chips 122, 124, respectively. In MCP 118, every other conductive line is associated with connections from one of chips 122, 124. In other words, if the conductive lines are consecutively numbered, the odd ones are connected to pads on one of the chips and the even ones are connected to pads on the other chip.

Figure 11:
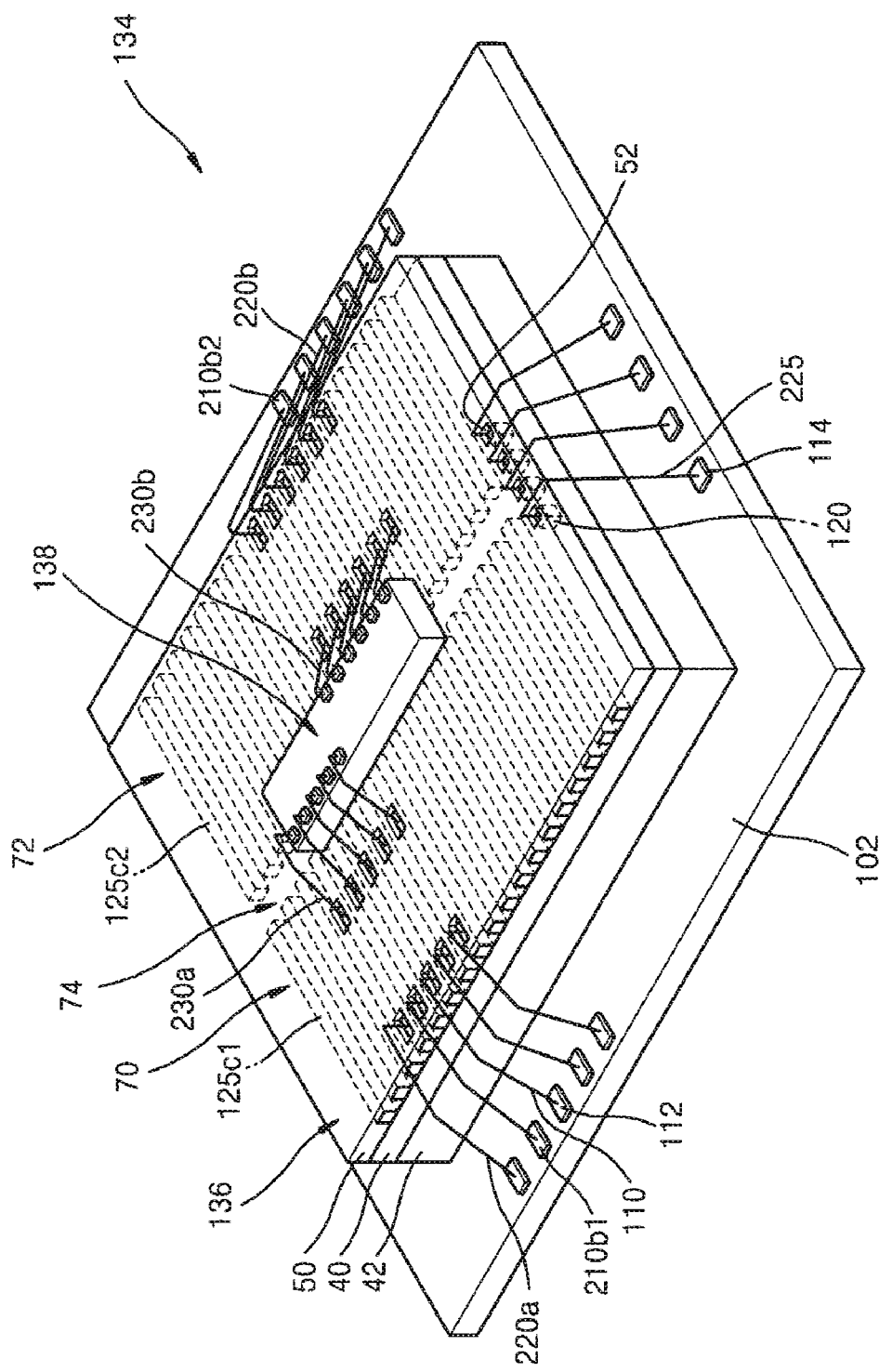
FIG. 11 is a perspective, somewhat schematic view of a third MCP constructed in accordance with an example.

Indicated generally at 134 in FIG. 11 is an MCP. The MCP includes a first semiconductor chip 136 and a second semiconductor chip 138. Structure that corresponds to previously identified structure is either unnumbered or carries the same identifying number. Chip 136 is constructed similarly to chip 68 in FIG. 6. And chip 138 is mounted on chip 136 similarly to the way chip 100 is mounted on chip 98 in FIG. 9.

As can be seen, pads on one side of chip 138 are connected via wire bonds as previously described to adjacent lines in line group 70, and the pads on the other side are connected via wire bonds to adjacent lines in line group 72. Each of the lines to which a pad on chip 138 is connected is in turn connected via another wire bond to a terminal on substrate 102. As a result, the pitch of the pads or the number of pads along the edges of the second chip, may be increased because at least two sides of chip 136 may be used as signal paths via the metal line groups 70, 72.

Figure 12:
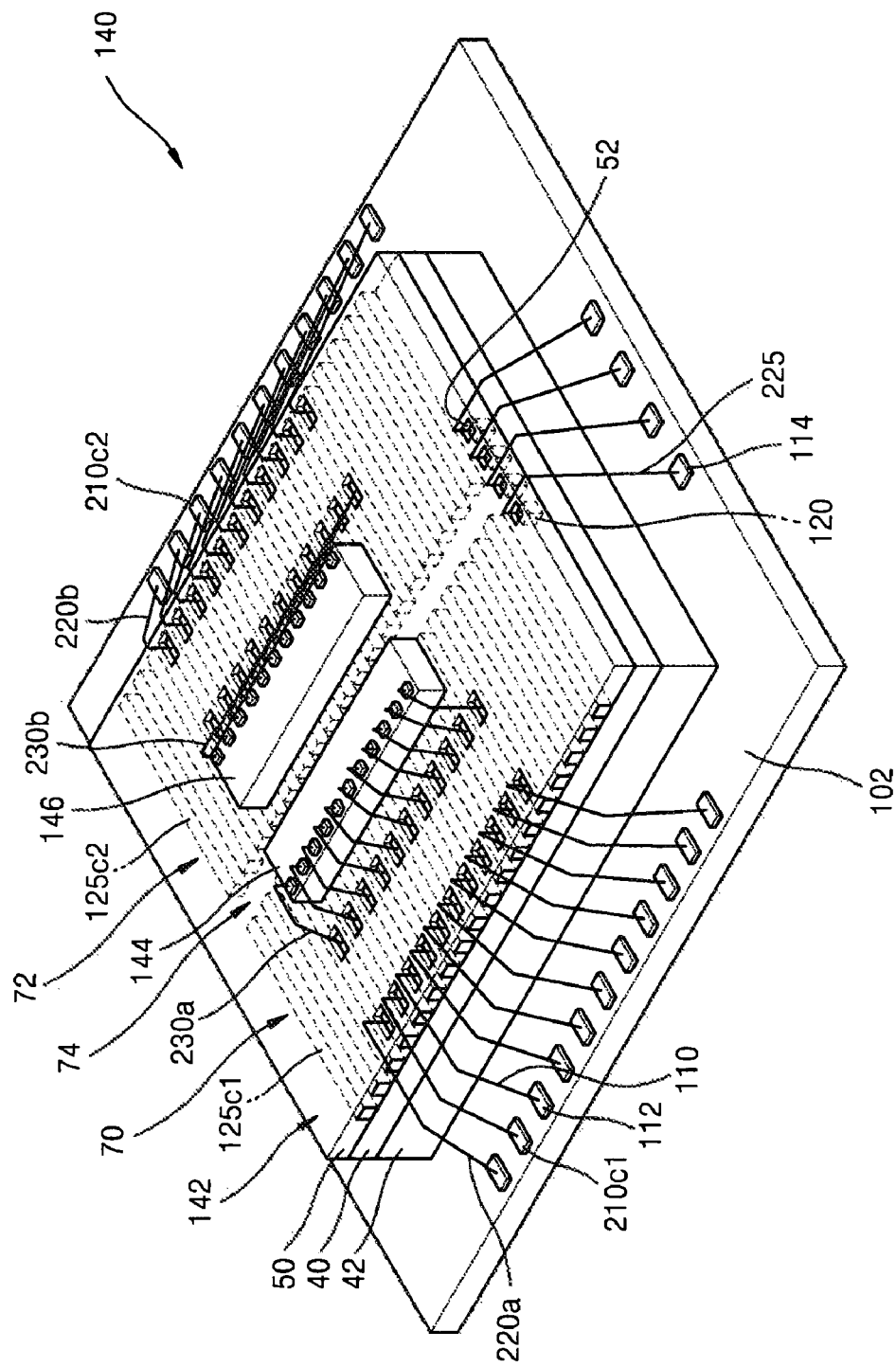
FIG. 12 is a perspective, somewhat schematic view of a fourth MCP constructed in accordance with an example.

Indicated generally at 140 in FIG. 12 is an MCP. The MCP includes a first semiconductor chip 142, a second semiconductor chip 144, and a third semiconductor chip 146. Structure that corresponds to previously identified structure is either unnumbered or carries the same identifying number. Chip 142 is constructed similarly to chip 136 in FIG. 11. And chips 144, 146 are mounted on chip 142 similarly to the way previously described chips are mounted on the first semiconductor chip.

In MCP 140 the pads on chip 144 are connected via wire bonds to conductive lines in group 70 in the manner previously described, and the pads on chip 146 are connected to the conductive lines in group 72. The two groups of conductive lines are in turn connected via wire bonds to terminals on substrate 102, also as previously described. This approach provides for a high density MCP.

Figure 13:
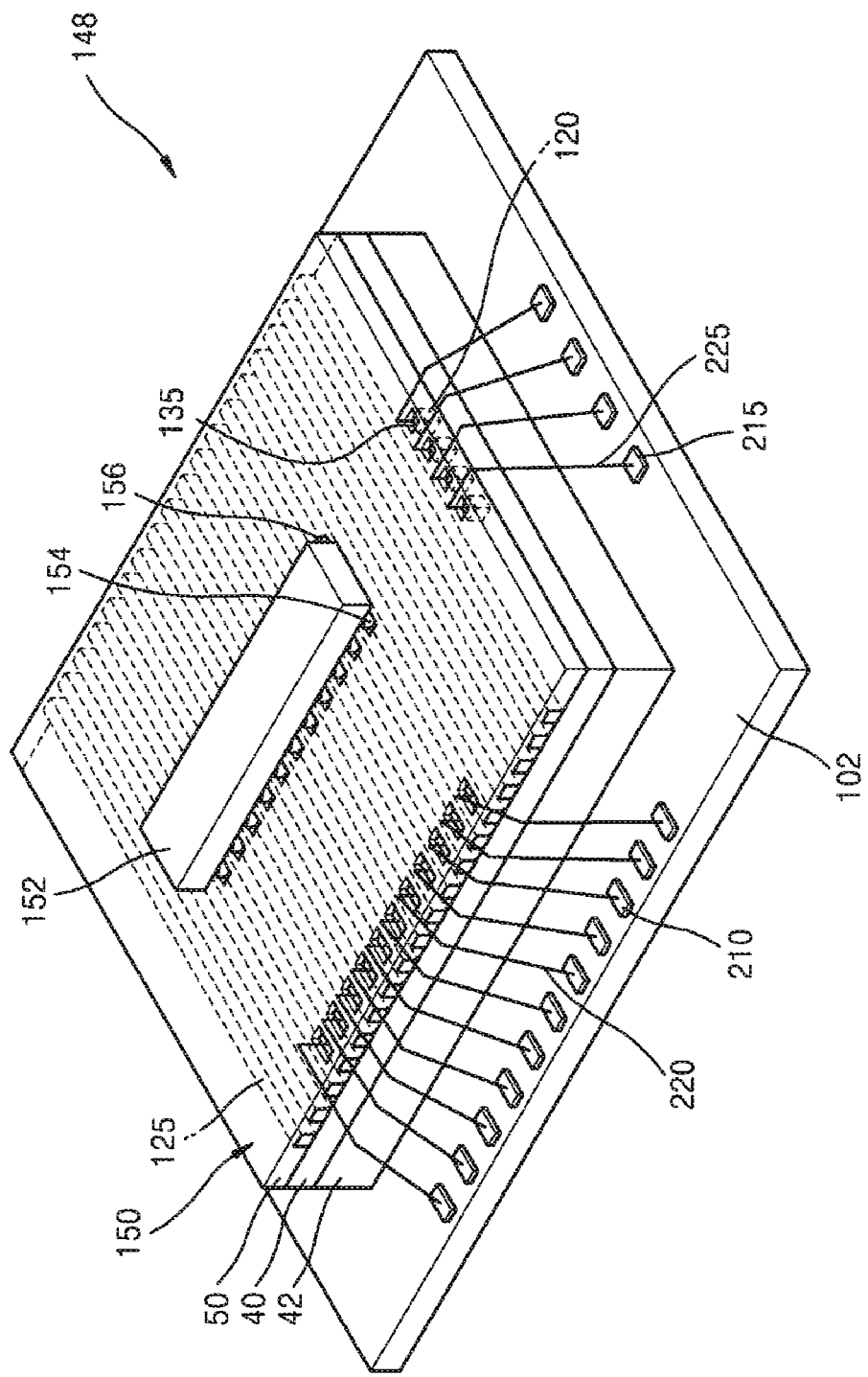
FIG. 13 is a perspective, somewhat schematic view of a fifth MCP constructed in accordance with an example.
Figure 14:
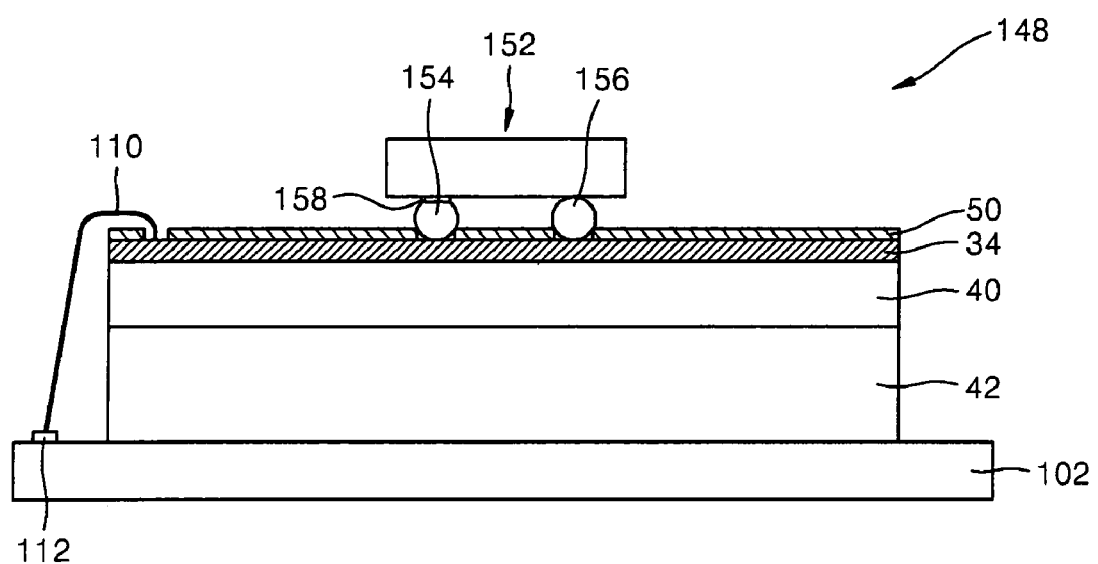
FIG. 14 is a cross sectional view of the fifth example.

Indicated generally at 148 in FIG. 13 is an MCP. The MCP includes a first semiconductor chip 150 and a second semiconductor chip 152. Structure that corresponds to previously identified structure is either unnumbered or carries the same identifying number. Chip 150 is constructed similarly to chip 98 in FIG. 9. Chip 152 is mounted on chip 150 using solder bumps 154, 156, best seen in FIG. 14. Solder bump 154 is mounted on a chip pad 158 that is connected to internal circuitry of chip 152. But bump 156 provides only structural support for chip 152; it is not connected to any internal chip circuitry. Both bumps 154, 156 are supported on metal line 34, which carries whatever voltage appears on pad 158. The pitch of the bumps on chip 152 is substantially the same as the pitch of the conductive lines, like conductive line 34, on chip 150. This approach facilitates use of flip chip bonding with the bumps being formed on chip 152. As a result, there are no wire bonds connected to the second chip, thus eliminating disadvantages associated with use of wire bonds.

In an alternative approach (not shown) conducting bump 154 may be received completely within the opening in the passivation layer over conductive line 34 with the underside of chip 152 being supported on passivation layer 50. This may require a thicker passivation layer than depicted in FIG. 14, but eliminates the need for a support bump, like bump 156, because the chip is resting on and supported by passivation layer 50.

In another alternative approach, the first semiconductor chip 150 can be mounted on the substrate 102 with its active surface, which includes chip pads, facing substrate 102. In that structure, an insulating layer (not shown) can be formed on the surface opposite the active surface of the first semiconductor chip 150, namely the exposed surface of the semiconductor substrate 42. The conductive lines can be formed on the insulating layer (not shown). The first semiconductor chip 150 can be coupled to substrate 102 by flip chip bonding and the conductive lines can be used to form electrical connections between the second semiconductor chip 152 and the substrate 102. The second semiconductor chip may be connected to the conductive lines in any manner described herein.

Figure 15:
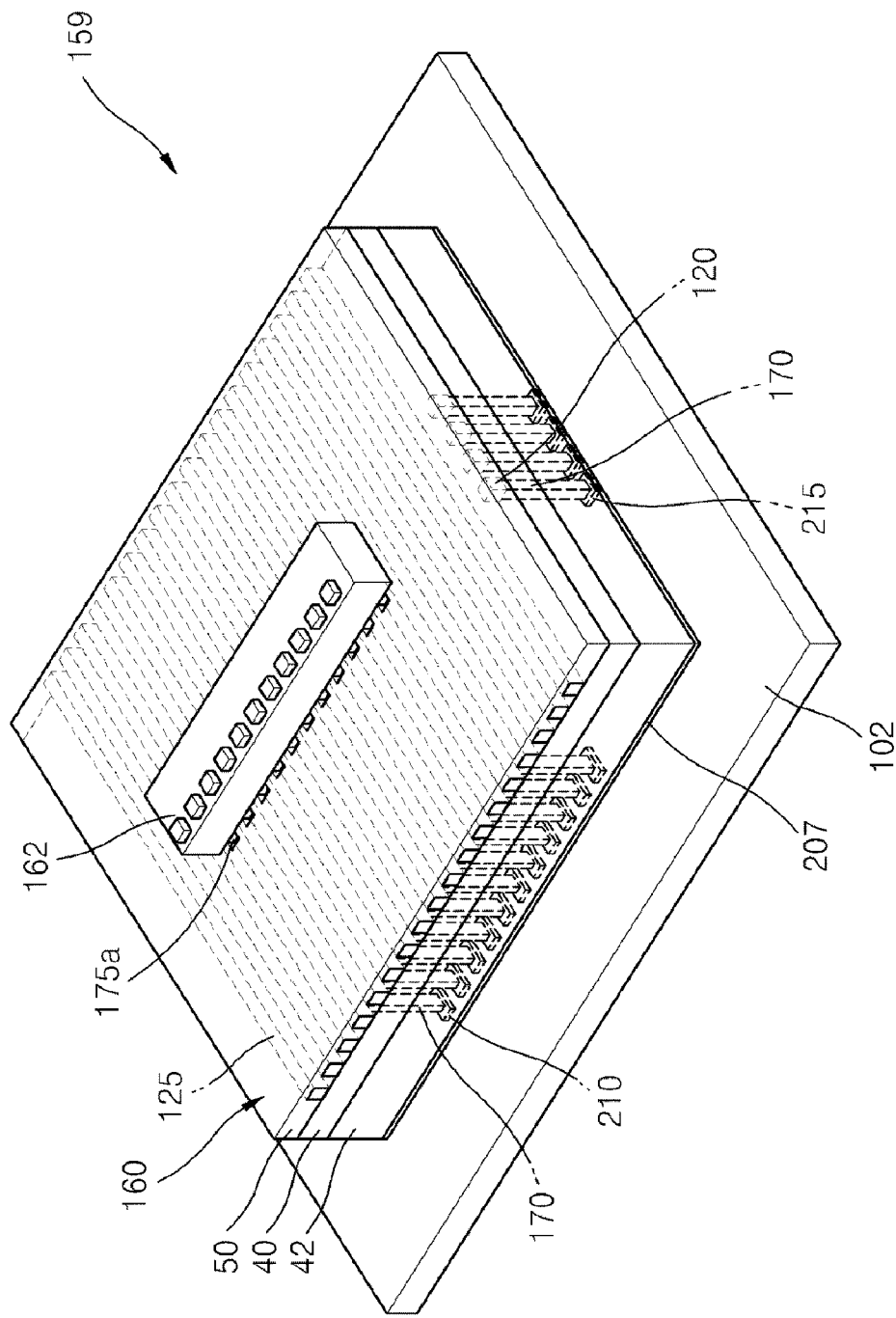
FIG. 15 is a perspective, somewhat schematic view of a sixth MCP constructed in accordance with an example.
Figure 16:
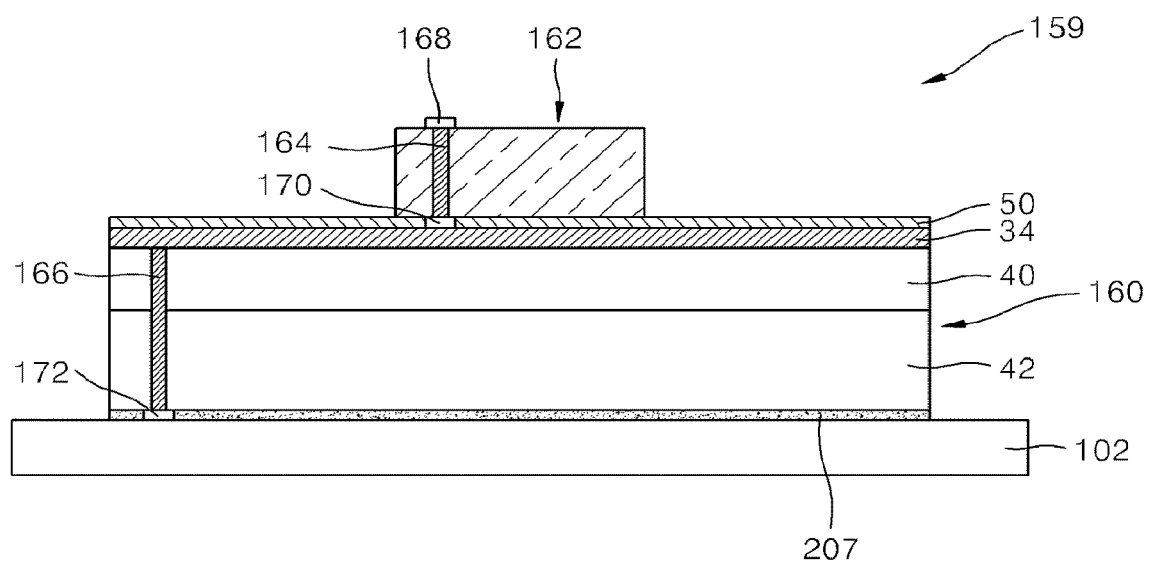
FIG. 16 is a cross sectional view of the sixth example.

Indicated generally at 159 in FIGS. 15 and 16 is an MCP. The MCP includes a first semiconductor chip 160 mounted on the substrate 102 with an adhesive layer 207 and a second semiconductor chip 162. Structure that corresponds to previously identified structure is either unnumbered or carries the same identifying number. Both chips are constructed similarly to chip 80 in FIG. 7 in that each has conductive TSVs, like TSV 166 in chip 160 and TSV 164 in chip 162.

One end of TSV 164 is connected to a conductive pad 168 formed on chip 162. Pad 168 is connected to internal circuitry of chip 162. The other end of TSV 164 is connected to a redistributed pad 170, which is in turn mounted on conductive line 34. Alternatively, TSV 164 may be directly connected to conductive line 34 without the need for redistributed pad 170.

The upper end of a TSV 166 (in chip 160) is connected to the underside of conductive line 34 with the lower end being connected to a terminal 172 formed on substrate 102. As a result, an internal circuit connection in chip 162 is redistributed via pad 168, TSV 164, conductive line 34, and TSV 166 to terminal 172 on substrate 102. This approach obviates the need for any wire bonding. In other words, it provides an MCP without any wire bonds. The first semiconductor chip 160 is secured to substrate 102 with an adhesive layer 207.

Figure 17:
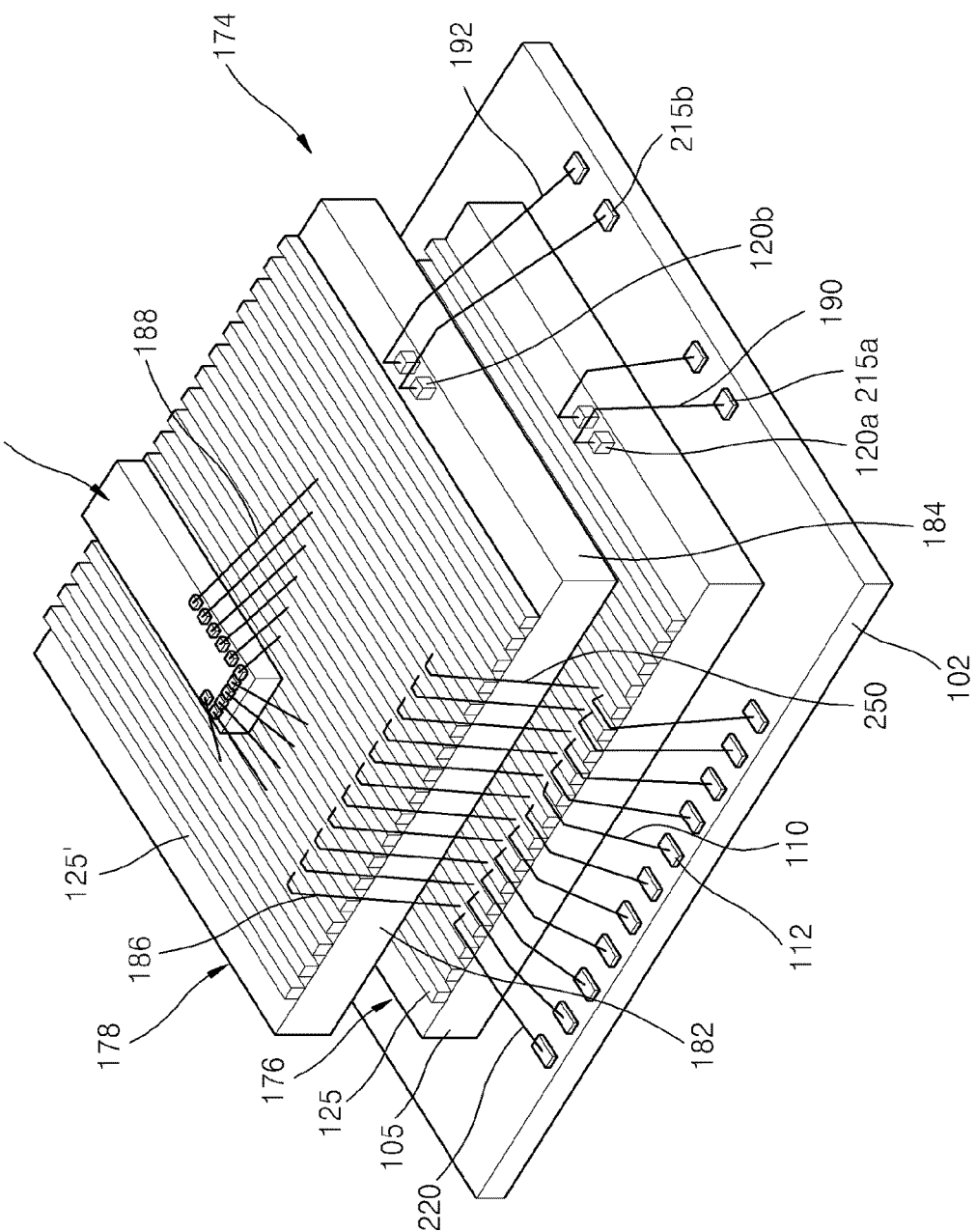
FIG. 17 is a perspective, somewhat schematic view of a seventh MCP constructed in accordance with an example.

Indicated generally at 174 in FIG. 17 is an MCP. The MCP includes a first semiconductor chip 176, a second semiconductor chip 178, and a third semiconductor chip 180. Structure that corresponds to previously identified structure is either unnumbered or carries the same identifying number. Chips 176, 178 are constructed similarly to chip 98 in FIG. 9. Chips 176, 178 are substantially identical to one another and may comprise, e.g., memory chips. As can be seen, chip 178 is mounted on chip 176 with the centers of both chips offset from one another. This results in two sides of chip 178 lapping over two edges of chip 176 with substantial portions of the other two sides 182, 184 of chip 176 being set back from the other two edges of chip 176. As a result, wire bond connections, like wire bond 110, may be made between the conductive lines on chip 176 and the terminals on substrate 102, like terminal 112, and further wire bond connections, like wire bond 186, may be made between the conductive lines on chip 178 and the conductive lines on chip 176. It is of course possible to stack chips of different sizes with the larger chip preferably being beneath a smaller chip.

Chip 180, which may be, e.g., an LSI circuit such as a processor, is mounted on chip 178 using adhesive. The pads on chip 180 are connected to conductive lines on chip 178 using wire bonds, like wire bond 188. As a result, circuitry internal to chip 180 may be connected via wire bonds, like wire bond 188, to the conductive lines on chip 178. These conductive lines are connected via wire bonds, like wire bond 186, to conductive lines on chip 176, which are in turn connected via wire bonds, like wire bond 110, to terminals, like terminal 112 on substrate 102.

The terminals on chips 176, 178 are connected via wire bonds, like wire bonds 190, 192, respectively, to terminals on substrate 102. In an alternative embodiment (not shown) TSVs, like those shown in FIGS. 7, 15, and 16, may be used to provide some or even all of the connections shown as wire bonds in FIG. 17.

Figure 18:
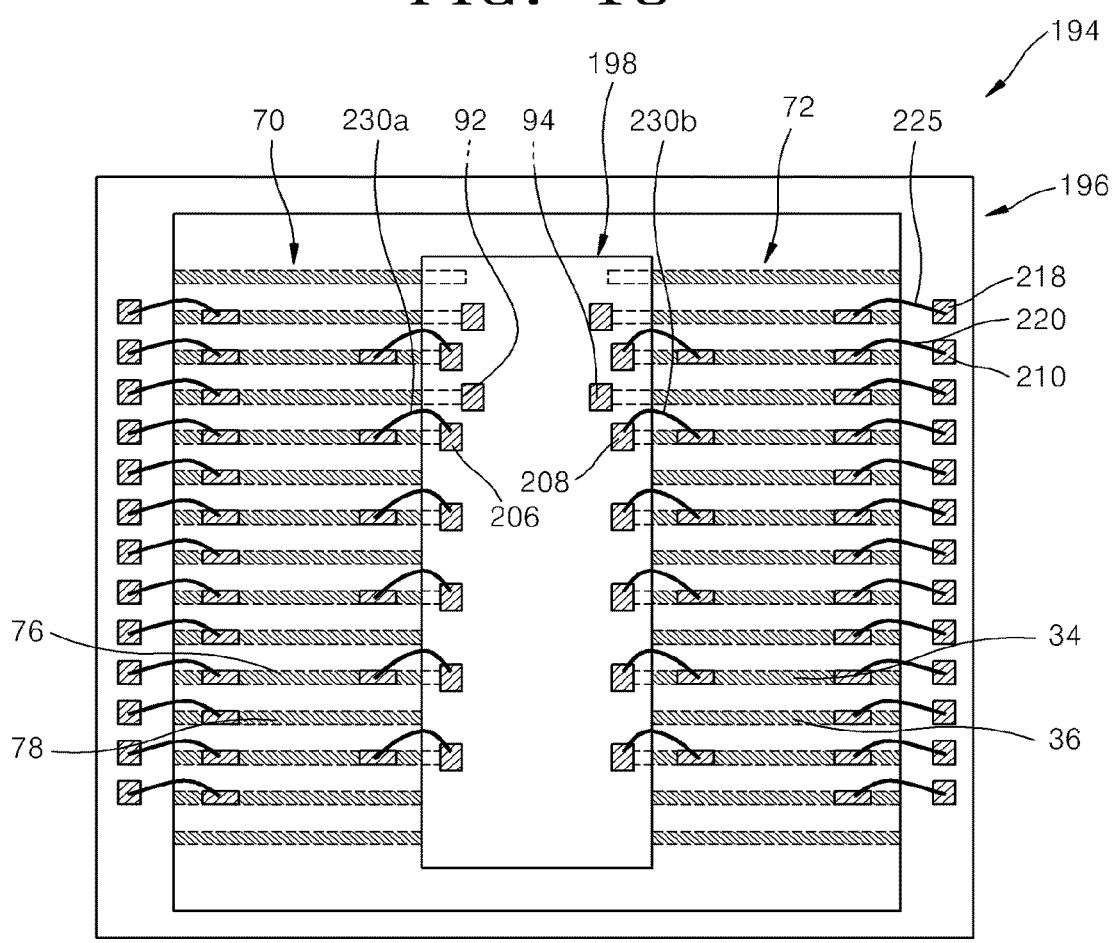
FIG. 18 is a top, plan, somewhat schematic view of a eighth MCP constructed in accordance with an example.

Indicated generally at 194 in FIG. 18 is an MCP. The MCP includes a first semiconductor chip 196 and a second semiconductor chip 198. Structure that corresponds to previously identified structure is either unnumbered or carries the same identifying number. Chip 196 is constructed similarly to chip 90 in FIG. 8. Chip 196 includes a plurality of conductive chip pads, like pads 92, 94 disposed on an upper surface of chip 196 beneath chip 198. These pads on chip 196 are disposed in two substantially parallel rows beneath chip 198 with pad 92 being in one row and pad 94 in the other.

Every other conductive line in each of groups 70, 72 is connected to one of the pads, like pads 92, 94. Every other conductive line in each of groups 70, 72 is connected to a conductive pad, like pads 206, 208, on the upper surface of chip 198 via wire bonds, like wire bonds, 230a, 230b, respectively. Put differently, every even conductive line is connected to pads, like pads 92, 94, on the upper surface of chip 196, and every odd conductive line is connected to pads, like pads 206, 208, on the upper surface of chip 198, with the latter connections being made with wire bonds, like wire bonds 230a, 230b.

Further wire bonds, like wire bonds 225, 220, connect the conductive lines to terminals, like terminals 218, 210, respectively, on substrate 102. In an alternative embodiment (not shown), a chip smaller than chip 198 is mounted on chip 196 between the two rows of pads on chip 196. In other words, the second chip does not cover the pads on the first chip.

Figure 19:
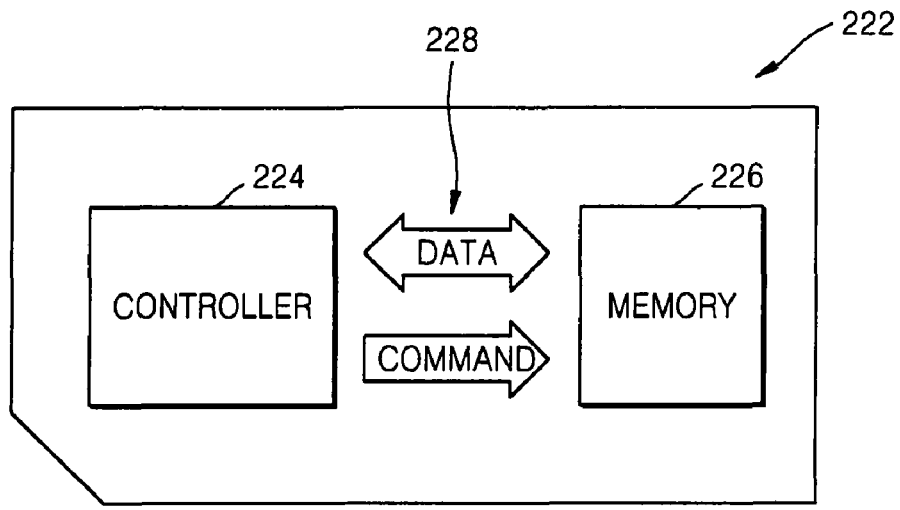
FIG. 19 is a schematic diagram of a card constructed in accordance with an example.

Turning now to FIG. 19, indicated generally at 222 is a schematic diagram of a card constructed in accordance with another example. Card 222 may be, e.g., a multimedia card (MMC) or a secure digital card (SD). Card 222 includes a controller 224 and a memory 226, which could be a flash, PRAM, or another type of non-volatile memory. A communication channel, indicated generally at 228, permits the controller to provide commands to the memory and to transfer data into and out of memory 226. Controller 224 and memory 226 may comprise an MCP in accordance with any of the previously described embodiments. The card 222 can have a larger density than conventional type. In one example, it is possible to remove interposer chips, so that card thickness can be reduced with respect to the conventional card having interposer chips. Additionally, according to various examples, defects from card caused by broken wiring can be reduced, so that reliability of card can be increased.

Figure 20:
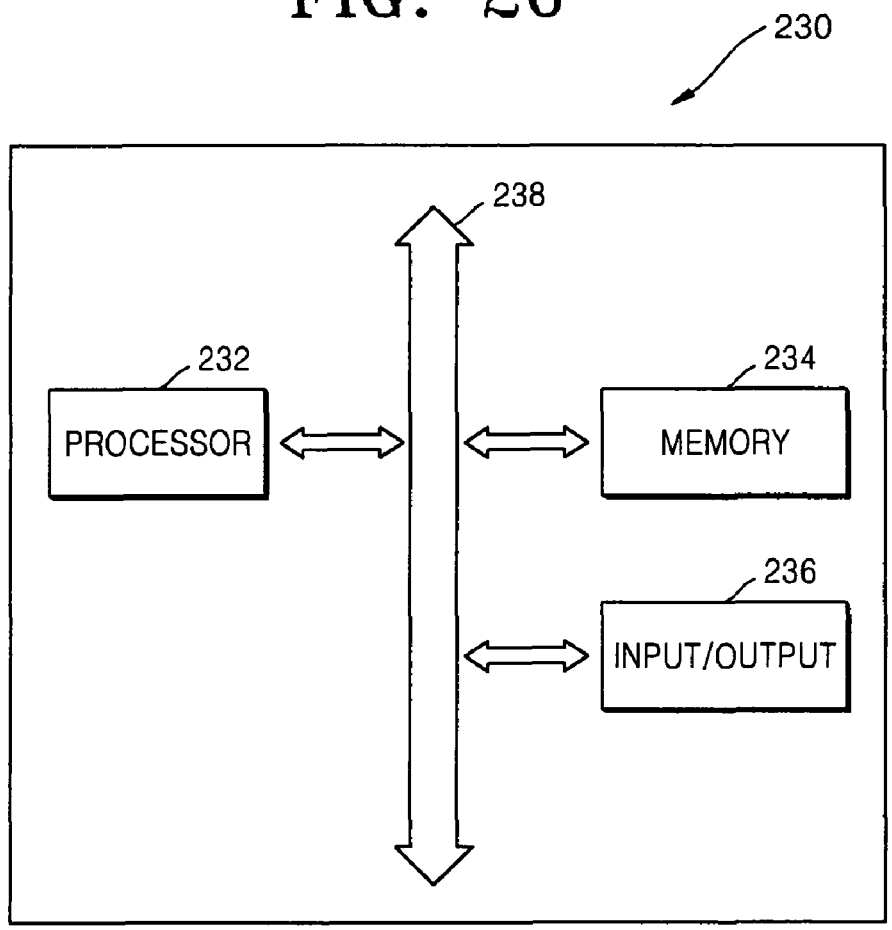
FIG. 20 is a schematic diagram of a system constructed in accordance with an example.

Considering now FIG. 20, indicated generally at 230 is a system constructed in accordance with another example. System 230 may be, e.g., a computer system, a mobile phone, an MP3 player, a GPS navigation device, a solid state disk (SSD), a household appliance, etc. System 230 includes a processor 232; a memory 234, which could be a DRAM, flash, PRAM, or another type of memory; and an Input/Output Device 236. A communication channel 238 permits the processor to provide commands to the memory to transfer data into and out of memory 234 via channel 238. Data and commands may be transferred to and from system 230 via Input/Output device 236. Processor 232 and memory 234 may comprise an MCP in accordance with any of the previously described examples. Examples of this disclosure can make the stable system at least because examples of this disclosure can reduce defects caused by a broken wire.

Figure 21:
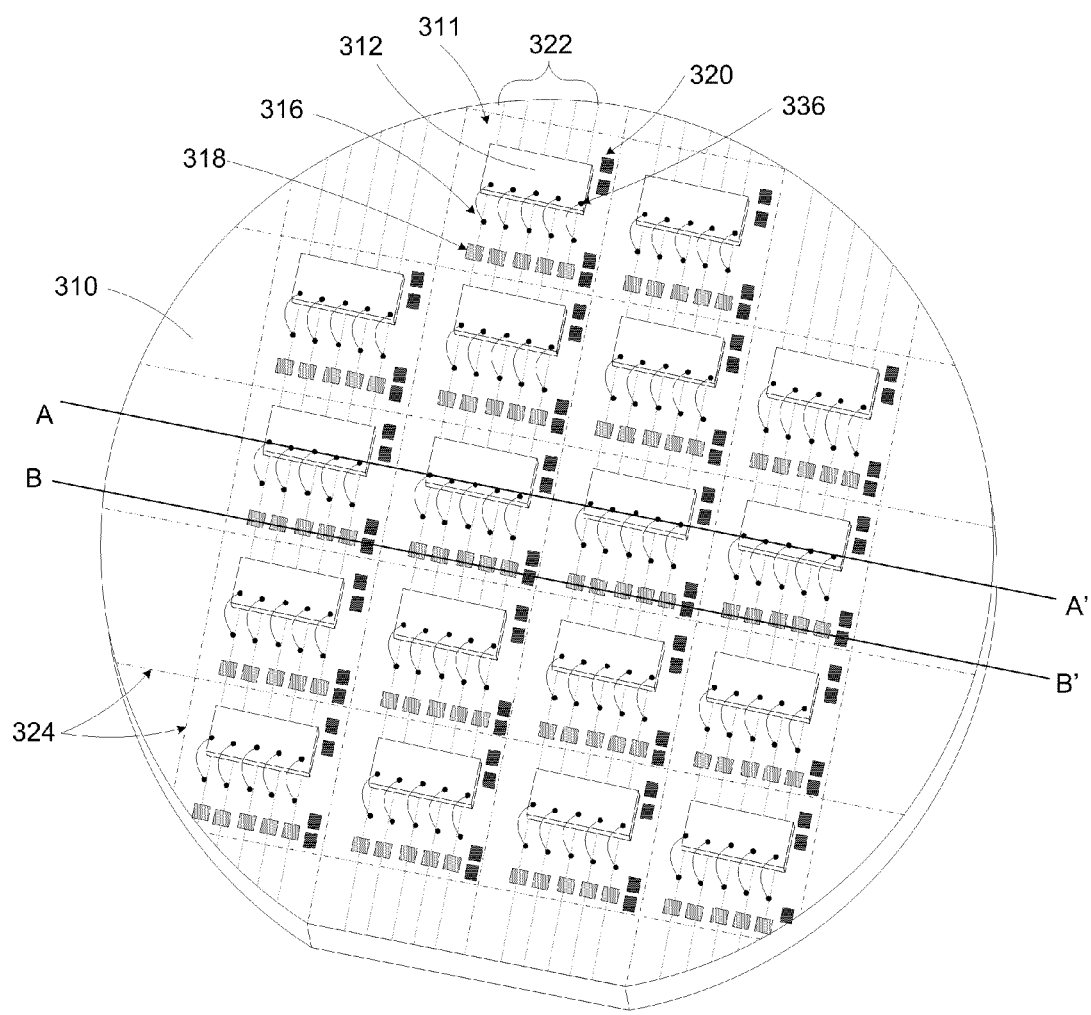
FIG. 21 diagrammatically illustrates a perspective view of an exemplary electrical connection scheme in for MCPs on a wafer before singulation.

Referring to FIG. 21, a perspective view diagrammatically illustrates elements of an exemplary MCP structure having a semiconductor chip on a semiconductor wafer before singulation. In this disclosure, the term "MCP portion" or "MCP element" or similar such language, refers to those elements or portions of an MCP whether or not those elements/portions have been into a finally assembled, singulated MCP. Semiconductor wafer 310, such as a silicon or germanium substrate, comprises multiple die areas, such as die area 311. Internal circuits (such as internal circuit 328 illustrated in the cross-sectional view in FIG. 22a) are formed in the die areas of the semiconductor wafer 310. The second semiconductor chips (including their own internal circuits), such as 312, are disposed on semiconductor wafer 310. It is noted that the second semiconductor chips may or may not include packaging. For example, the second semiconductor chips 312 may be bare chips, or may have been separately packaged prior to disposing the second semiconductor chips 312 on the semiconductor wafer 310.

In this example, electrical connections are provided from die pads of the second chips to the backside (opposite the side of wafer 310 or substrate 310 which is processed to form circuits 328) of semiconductor wafer 310 to provide power and signal paths from MCP terminals to the circuits of the second chips. In this example, electrical connections are accomplished by using conductive lines and through-silicon-vias (TSVs). Specifically, conductive lines, such as 322, are provided. The conductive lines in this example are linear, parallel, spaced apart at substantially constant pitch, and may extend across the entire die. The conductive lines 322 may extend across an entire surface of a die area 311, for example, from one saw line 324 to an opposite saw line 324, corresponding to one edge to another edge of the MCP after singulation. However, the conductive lines may take other patterns and forms. TSVs 318, and lower chip die pads 320, are formed in and/or on semiconductor wafer 310. The conductive lines 322 and the lower die pads 320 are connected to TSVs 318.

In each die area 311, a second chip 312 is mounted thereon. Die pads 336 of the second chip are electrically connected to the TSVs 318 of the die area through the conductive lines 322 and bonding wires 316. The TSVs 318 extend the electrical connection to the backside of the semiconductor wafer (310), as illustrated in FIG. 22b.

Figure 22A:
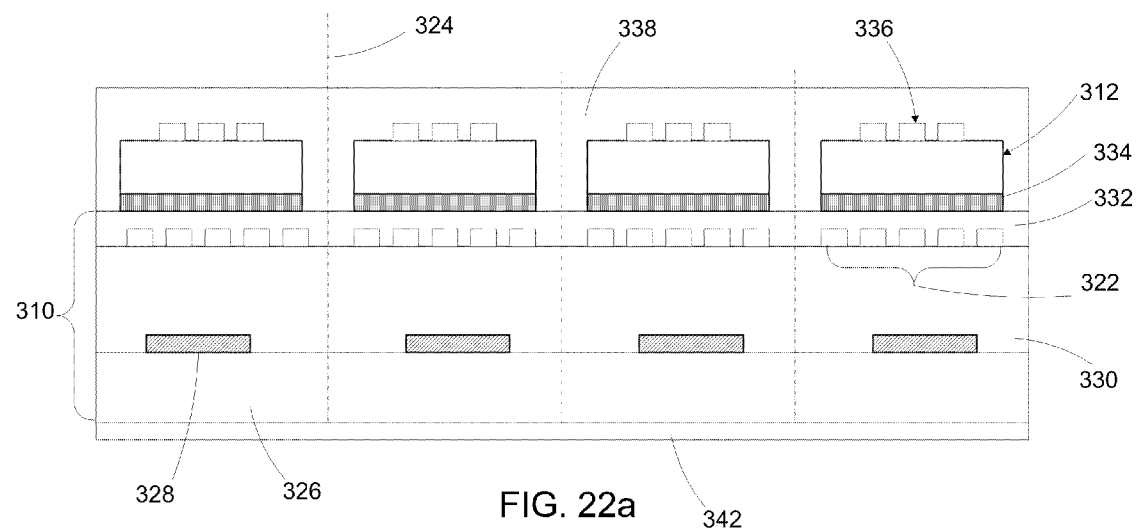

FIG. 22a is a cross-sectional view of the MCP portions of FIG. 21 taken along line AA', extending along the second chip including the second chip pads 336. Referring to FIG. 22a, semiconductor wafer 310 comprises semiconductor substrate 326, such as single-crystal silicon, germanium, or other semiconductor substrates. The semiconductor substrate 326 is typically a wafer, often sliced off a single crystal (e.g., silicon) ingot. Internal circuits 328 are formed in and/or on the semiconductor substrate (326). Specifically, an internal circuit 328 is formed in a corresponding die area (311 in FIG. 21) of the semiconductor substrate 326. Dielectric layer 330 is formed on semiconductor substrate 326 and the internal circuits 328. Dielectric layer 330 may be one or more interlayer dielectric layers (referred to as ILD). For example, dielectric layer 330 may be the uppermost ILD used in forming circuits 328 or may also include other ILDs used to form the circuits 328. Conductive lines 322 are formed on the dielectric layer 330. The conductive lines 322 can be covered by an insulating layer 332. In this example, insulating layer 332 is a passivation layer used to passivate the internal circuits 328 and/or generally protect the wafer. For example, the passivation layer 332 allows the semiconductor wafer to be exposed to the atmosphere (or other environments having chemical components, such as oxygen, that may spontaneously or non-spontaneously react with wafer elements without being protected by the passivation layer) without damaging the wafer. In one example, the passivation layer may be formed from a resin layer, such as a polymer. Other exemplary passivation layers (and insulating layers 332 which are not passivation layers) include silicon nitride, silicon oxide, silicon oxynitride or combinations thereof. While not shown in FIG. 22a, a chip manufacturer often creates vias through insulating layer 332 to expose the lower die pads 320. When insulating layer 332 is formed as a passivation layer, the wafer protected with the passivation layer may then be safely removed from a sealed environment, such as various semiconductor chip manufacturing equipment which provide a sealed environment (e.g., vacuum or inert). The passivation layer 332 then allows the wafer 311 to be exposed to atmospheric conditions (e.g., air) and shipped to a separate facility (e.g. a packaging facility) for packaging if desired. As noted above, use of an passivation layer is one example of insulating layer 332; and insulation layer 332 may be omitted completely according to some manufacturing methods, or be an insulating layer other than a passivation layer. Some of these alternatives are discussed in more detail below.

The second chips, such as 312, are disposed on wafer 310. Specifically, the second chips 312 are disposed on insulating layer 332 and above the corresponding internal circuits 328 formed of wafer 310. The second chips 312 each have a plurality of chip pads 336 for providing signals (e.g., data, address and control signals), ground and other voltages (external power sources, such as Vcc) to a circuit (not shown) internal to the second chip 312. Adhesive layer 334 can be provided to attach the second chips 312 to wafer 310, here, directly on insulating layer 332. Encapsulation layer (or molding layer) 338 can be deposited across an upper portion of the wafer 310 including the second chips 312 so as to encapsulate the second chips 312.

Figure 22B:
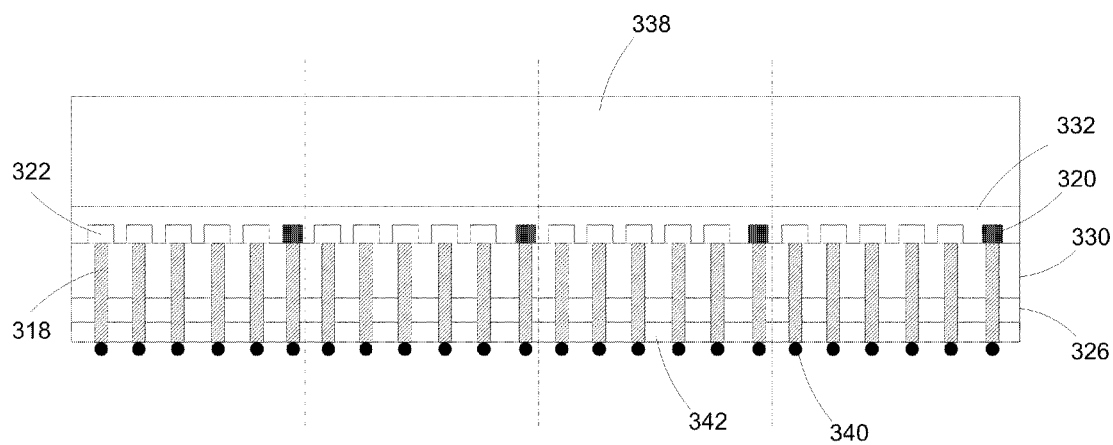

The pads 336 of the second chips 312 are connected to conductive lines 322 through bonding wires 316 (see FIG. 21), which in turn are connected to the corresponding TSVs 318, which in turn are connected to bumps 340 (see FIG. 22b).

FIG. 22b is a cross-sectional view taken along line BB' in FIG. 21, along a line including through TSVs 318 in wafer 310 and a lower die pad 320. Of course, the arrangement of the TSVs and lower chip pads 320 can be other than the linear arrangements shown in FIG. 21. Referring to FIG. 22b, lower die pads 320 (die pads of the chip to be formed from wafer 310) are formed on the dielectric layer 330. On the backside of the wafer 310, insulating layer 342 is formed. TSVs, 318 are connected to the conductive lines 322 and the lower die pads 320. The TSVs span across the total thickness of the dielectric layer 330, the semiconductor substrate 326, and insulating layer 342 such that the TSVs are exposed at the backside of the wafer 310. The exposed TSVs at the backside of the wafer 310 are attached to terminals 340, such as bumps (e.g., solder balls) for connection to a system, such as that on a printed circuit board (not shown).

As is known, through silicon vias (TSV) comprise a conductor formed in a hole (or via) through a silicon substrate possibly including a larger portion or all of the wafer including the silicon substrate. Sidewalls of such a via may be filled or have formed on its sides a conductive material. The metal may be formed in such a via by electroplating, for example. A TSV formed prior to forming circuits in and/or on the wafer substrate is often referred to as a "via first" TSV. In this case, the TSV would not extend through layers later formed on the wafer substrate. A TSV formed after forming circuits in and/ or on the wafer substrate is often referred to as a "via last" TSV, and exists though more than just the wafer substrate, and possibly the entire wafer or the entire wafer except the passivation layer. It should be understood that the term "TSV", is used herein as a generic term for ease of description and allows for a via in a wafer which has a substrate made of a material other than silicon.

Figure 22C:
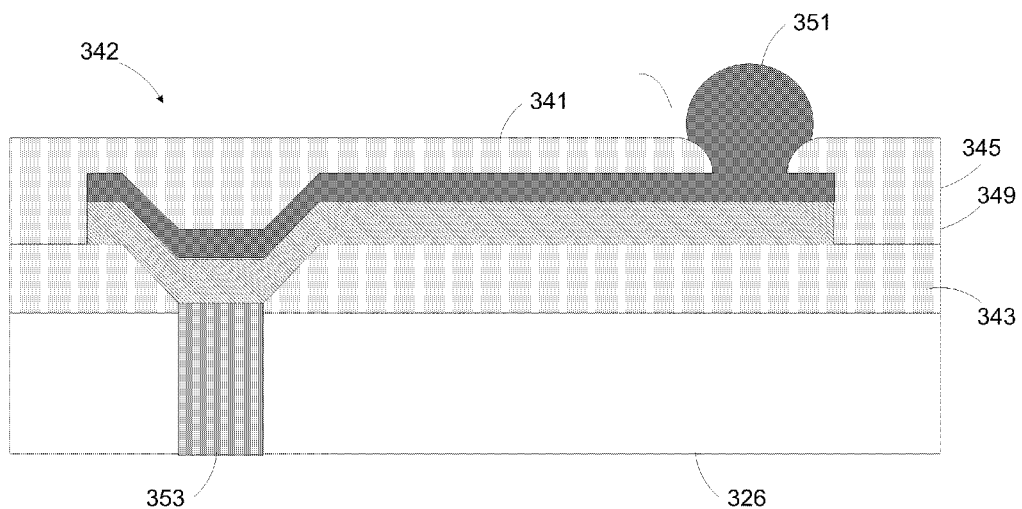

Insulating layer 342 formed on the backside semiconductor substrate 326 can be a single layer composed of one or more insulating materials, such as a dielectric material. Alternatively, insulating layer 342 can be a laminate comprising multiple layers. In one example, as illustrated in FIG. 22c, insulating layer 342 can be a redistribution layer including metal wiring layer 345 laminated between packaging ILD layers 341 and 343. As alternative features, additional layers can be provided. For example, seed metal layer 349 can be formed in favor of the fabricating the metal wiring layer 345. The seed metal layer 349 can be comprised of Ti and Cu, or other suitable conductive materials (e.g. metallic elements, metal alloys, or other materials). The metal wiring layer 345 may be comprised of Cu and Ni or other desired conductive materials, such as metallic elements, metal alloys, or other materials. Conductive ball (or bump or the like) 351 can be positioned in the structure and electrically (e.g. physically) connected to the metal wiring layer 345 at an opening of ILD layer 341. A TSV, such as TSV 353 in substrate 326 can be provided and electrically connected to the metal wiring layer 341 through seed metallic layer 349, as diagrammatically illustrated in FIG. 22c.

Figure 22D:
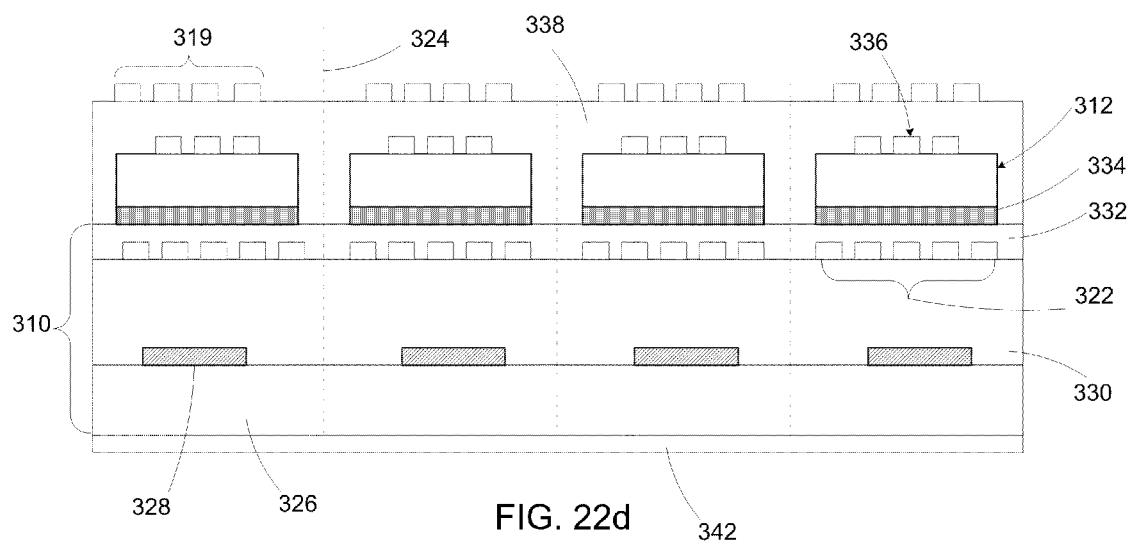
Figure 22E:
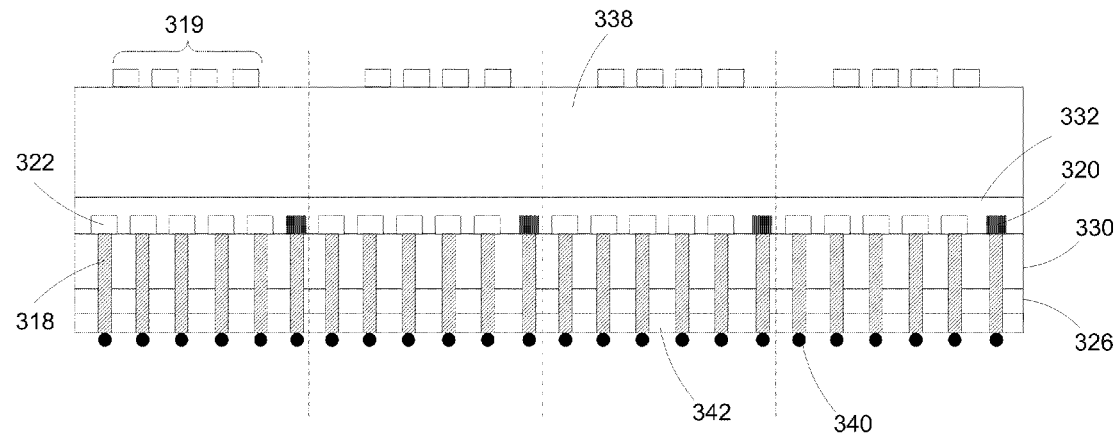

FIG. 22d and FIG. 22e, illustrate a possible variation of the example shown in FIGS. 22a and 22c. One or more conductive lines, such as conductive lines 319, can be formed on (e.g. on the external surface of) the encapsulation layer 338 that encapsulates the second semiconductor chips. In the example shown in FIG. 22d and FIG. 22e, that each die area has four conductive lines formed on the encapsulation layer 338. Four conductive lines 319 are shown for ease of discussion, but any desired numbers of conductive lines can be formed on an encapsulation layer (e.g. 338) of each die area. The conductive lines 319 have no electrical connections (e.g. no signal or voltage supply connections) to either the internal circuits 328 in wafer 310 or the circuits (e.g., integrated circuit) associated with the second semiconductor chip. Conductive lines 319 may be electrically floating. The features of conductive lines 319 with respect to both the wafer 310 and second chips 312 may be same as the features of conductive lines 322 with respect to the internal circuits 328 in wafer 310. Thus, conductive lines 319 may be used to facilitate connection of chip pads of a third semiconductor chip (not shown) in a manner similar to those described in this disclosure with respect to conductive lines 322 and chips within second chips 312, and such connections need not be repeated here. The combination including the third chip may be provided with an additional encapsulation (not show) to provide protection to the third chip and/or its electrical connections. As discussed in connection with other examples disclosed herein, the wafer may be singulated along scribe lines 324 to provide separate MCPs (or MCP elements) Singulation may be performed prior to or after mounting and/or connecting third chips.

Figure 23A:
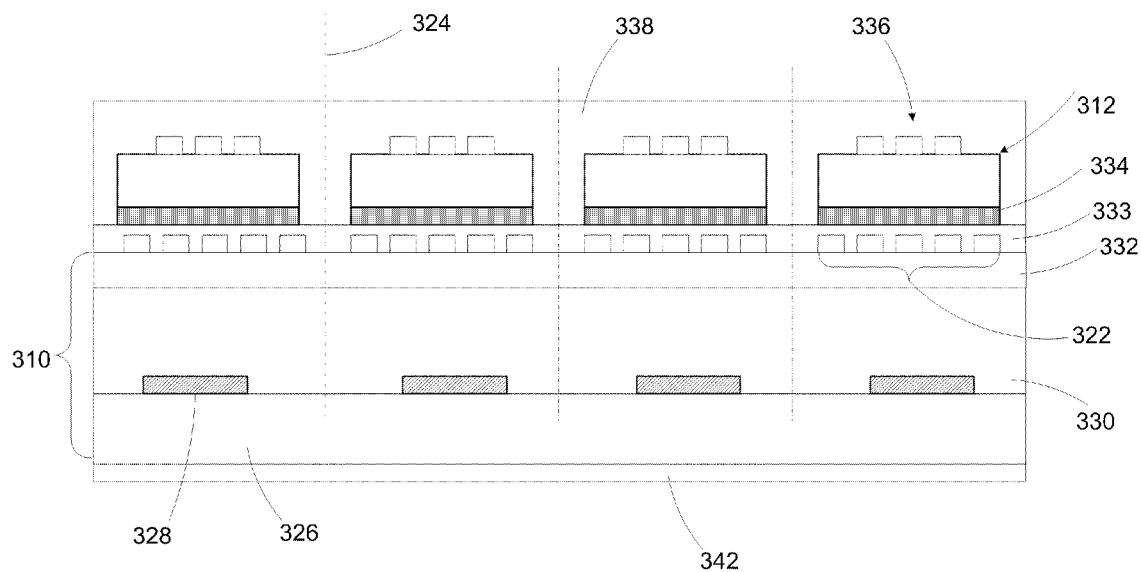
Figure 23B:
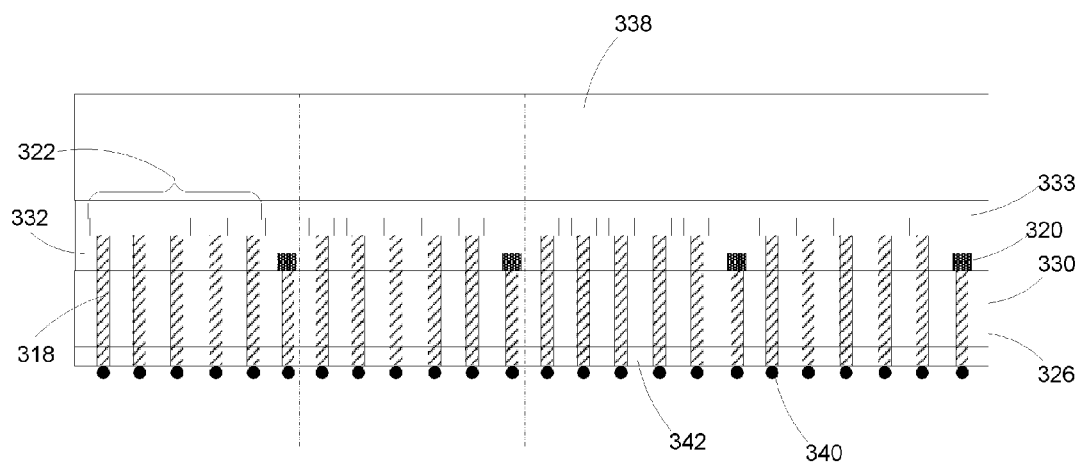

When insulation layer 332 is a passivation layer, instead of forming the passivation layer 332 on conductive lines 322, conductive lines may be formed on passivation layer 332, as illustrated in FIG. 23a and FIG. 23b. FIG. 23a and FIG. 23b are cross-sectional views taken respectively along lines AA' and BB' in FIG. 21.

Referring to FIG. 23a, which is a cross-sectional view taken along line AA' in FIG. 21, wafer 310 comprises semiconductor substrate 326 including internal circuits 328 formed therein. Dielectric layer 330 is formed on and/or as part of the internal circuits 328. The passivation layer 332 is formed on dielectric layer 330. Another insulating layer 342 is formed on the backside of semiconductor substrate 326. Dielectric layer 330 and passivation layer 332 and 342 can be the same as those discussed above with reference to FIG. 22a and FIG. 22b, which will not be repeated herein.

Unlike the that in FIG. 22a and FIG. 22b, conductive lines (e.g. conductive lines 322) in the example as shown in FIG. 23a and FIG. 23b are formed on the passivation layer 332; whereas the lower die pads (e.g. 20 shown in FIG. 23b) are formed on dielectric layer 330 and covered by the passivation layer 332. The conductive lines 322 and the lower chip pads 320 are located at different layers. Accordingly, the TSVs 318 connected to the conductive lines have different lengths than those connected to the lower chip pads, as diagrammatically illustrated in FIG. 23b. Conductive lines in FIG. 22a and FIG. 22b may be fabricated during a chip manufacturing process; while the conductive lines in FIG. 23a and FIG. 23b may be fabricated during a packaging process.

As seen in FIG. 23a and FIG. 23b, a resin layer or another insulating layer 333 can be provided on the conductive lines. The second chips, such as 312, can be mounted on the resin layer 333; and adhesive layer 334 can be alternatively used to secure the mounting of the second chips. On the backside of the semiconductor substrate (326), the insulating layer 342 can be provided; and terminals (e.g. solder balls) 340 are attached to the ends of the TSVs, as those illustrated in FIG. 22a and FIG. 22b.

Figure 24:
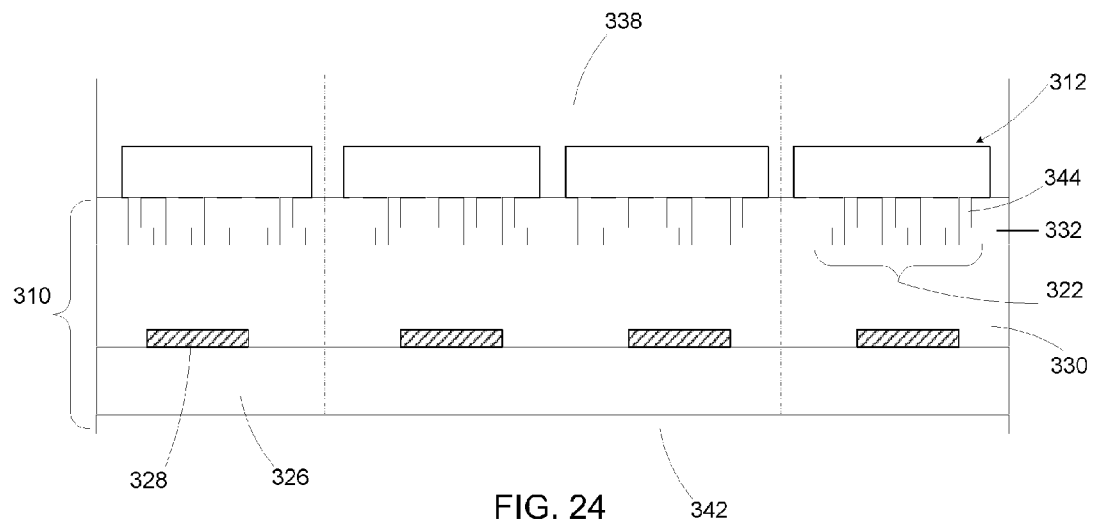
FIG. 24 is a cross-sectional view of another exemplary electrical connection scheme in MCPs on a wafer before singulation.

As another example, the second chips can be mounted to the lower chips by flip chip mounting, as diagrammatically illustrated in a cross-sectional view in FIG. 24, wherein the cross-sectional view is taken along line AA' in FIG. 21. Referring to FIG. 24, lower wafer 310 comprises a semiconductor substrate 326 having formed in and/or on internal circuits 328. Dielectric layer 330, which can be the same as that in FIG. 22a, is provided on the internal circuits 28 and/or as part of the internal circuits 328. Conductive lines (e.g. 322) in this example are deployed on the dielectric layer (330) and covered by insulating layer 332, which can be a passivation layer (e.g. a resin layer) as discussed above with reference to FIG. 22a. Bumps (solders), such as bumps 344, are provided and attached to the conductive lines (e.g. 322). The bumps (e.g. 344) are electrically connected to the second chips (e.g. 312) that are mounted on the insulating layer 332.

The conductive lines (e.g. 322) and the lower chip pads (not shown) are connected to TSVs (not shown); and the TSVs extend the electrical connection of the conductive lines and the lower chip pads to the backside of the semiconductor substrate, as that illustrated in FIG. 22b. An upper portion of the wafer with the second chips is encapsulated by encapsulation layer 338. In FIG. 24, the dielectric layer 330 can comprise the ILD (interlayer dielectric layer(s)) which provide insulation between various metal layers forming portions of circuits 328; and insulating layer 332 can be the passivation layer. However, when insulation layer 332 is a passivation layer, it will be appreciated by those skilled in the art that the conductive lines (e.g. 322) may be formed on the passivation layer (e.g., 332) and the lower chip pads (not shown) are formed from a different lower metal layer on dielectric layer 330 on which the passivation layer (e.g., 332) is at least initially formed, as illustrated in FIG. 23a and FIG. 23b.

Figure 25:
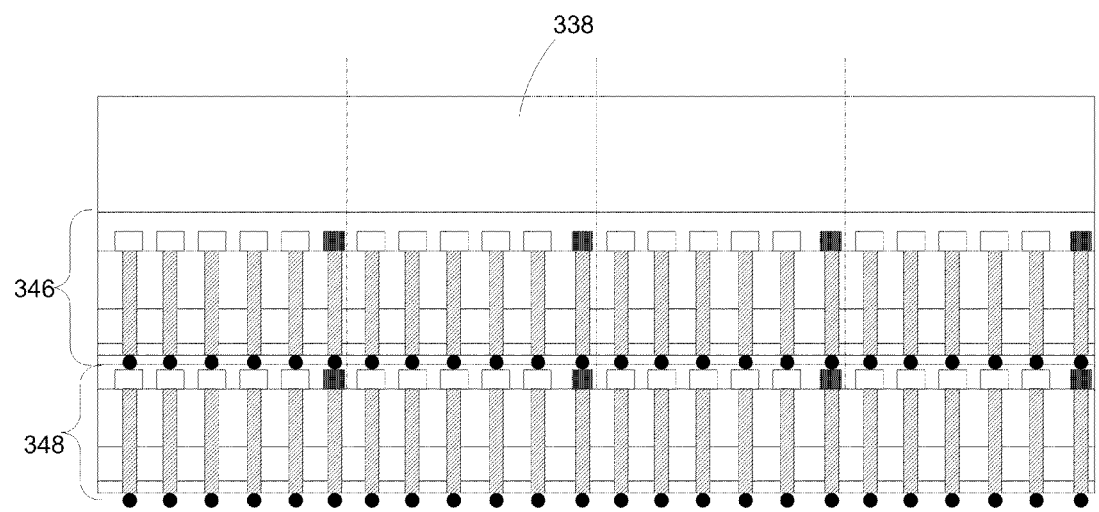
FIG. 25 is a cross-sectional view of yet another exemplary electrical connection in MCPs on a wafer before singulation.

As yet another example, multiple semiconductor wafers can be stacked vertically to form MCPs (or MCP portions on a wafer before singulation), an example of which is diagrammatically illustrated in FIG. 25. Referring to FIG. 25, a cross-sectional view corresponding to line BB' in FIG. 21 is illustrated therein. In this particular example, the wafer stack comprises first semiconductor wafer 346 and second semiconductor wafer 348. Encapsulation layer 338 may also be provided. At least the first semiconductor wafer 346 comprises conductive lines, such as conductive lines discussed above with reference to FIG. 22a, FIG. 22b, FIG. 23a, FIG. 23b, and FIG. 24; while the second semiconductor wafer 348 may or may not be provided with conductive lines. The second semiconductor wafer 348 in this example includes TSVs; and the first semiconductor wafer (346) may or may not be provided with TSVs. The first and second semiconductor wafers may correspond to memory chips, the memory chips may be identical or substantially identical, or have a pad with the same function positioned at the same relative location. Upper chips (not shown) mounted on the first semiconductor wafer and covered by encapsulation layer 38 corresponding to chips 312 in FIG. 21 may be logic chips.

In the example illustrated in FIG. 25, both of the first and second semiconductor wafers (346 and 348) comprise TSVs and conductive lines; and each can be configured as the same as those discussed above with reference to FIG. 22a, FIG. 22b, FIG. 23a, FIG. 23b, and FIG. 24. The conductive lines of the first semiconductor wafer are connected to the conductive lines of the second semiconductor wafer through the TSVs and solder balls of the first semiconductor wafer. The conductive lines of the second semiconductor wafer are connected to TSVs of the second semiconductor wafer; and the TSVs are connected to solder balls of the second semiconductor wafer. As a consequence, the conductive lines, TSVs, and solder balls of the first semiconductor wafer are aligned and electrically connected to the corresponding conductive lines, TSVs, and solder balls of the second semiconductor wafer, forming separate and parallel electrical connection channels from the conductive lines of the first semiconductor wafer to the solder balls of the second semiconductor wafer.

The semiconductor wafer as discussed above with reference to FIG. 24a and FIG. 24b can be fabricated in many possible ways. In one example, the MCP portions on the wafer (as well as individual MCPs after singulation) can be fabricated in two major processes—one in a chip making process and one in packaging process. Accordingly, the MCP portions (and individual MCPs) can be, though not required, fabricated in different facilities—one in a chip making facility and one in a packaging facility. In the chip making process, the conductive lines (e.g. 322) can be fabricated along with the lower wafer 310 (e.g. including the semiconductor substrate 326, the internal circuits 328, the dielectric layer 330, the TSVs 318, the lower chip pads 320, and the insulating layer 332). The lower wafer 10, especially with the insulating layer 332 formed from a passivation layer, can be transferred to a packaging process (e.g. to a packaging facility, during which the lower wafer may be exposed to the atmosphere or the like). In the packaging process, the second chips (e.g. 312) are mounted to the lower wafer and are wire-bonded to corresponding pads. The insulating layer 342 on the backside of the semiconductor substrate can be formed; and the terminals (e.g. 340) are attached to the exposed ends of the TSVs (e.g. 318). The MCP portions can then be singulated from the wafer so as to obtain individual MCPs. The above method is detailed in the flow chart shown in FIG. 26.

Figure 26:
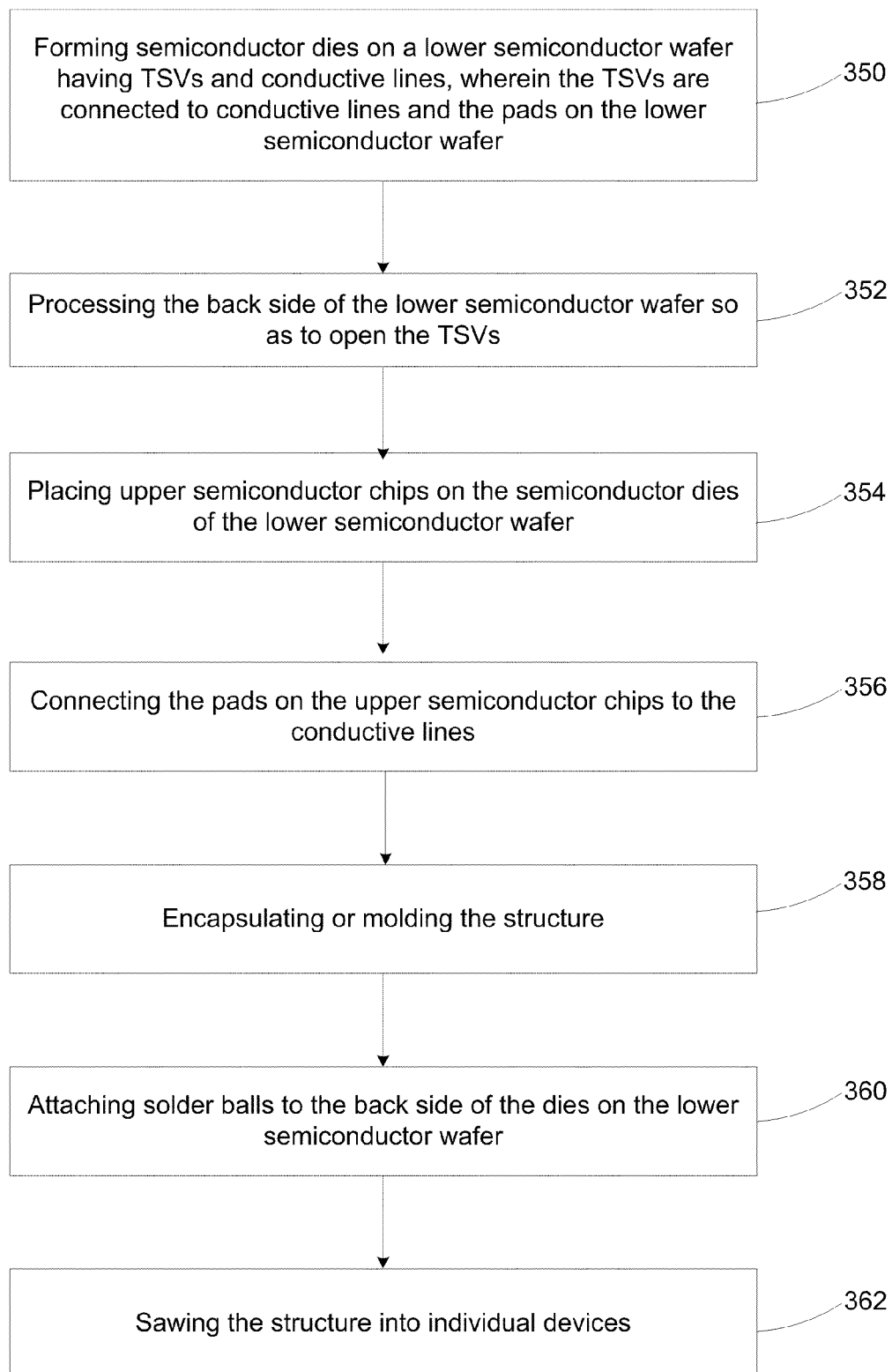
FIG. 26 is a flow chart showing steps executed in an exemplary method of making the electrical connections as illustrated in FIG. 22a and FIG. 22b.

Referring to FIG. 26, semiconductor dies are formed on a lower semiconductor wafer having TSVs and conductive lines, wherein the TSVs are electrically connected to the conductive lines and the pads on the lower semiconductor wafer (step 350). This process is performed in a chip making process (e.g. in a chip making facility); and is better illustrated in FIG. 27a wherein a cross-sectional view taken along line AA' in FIG. 21 is illustrated therein.

Figure 27A:
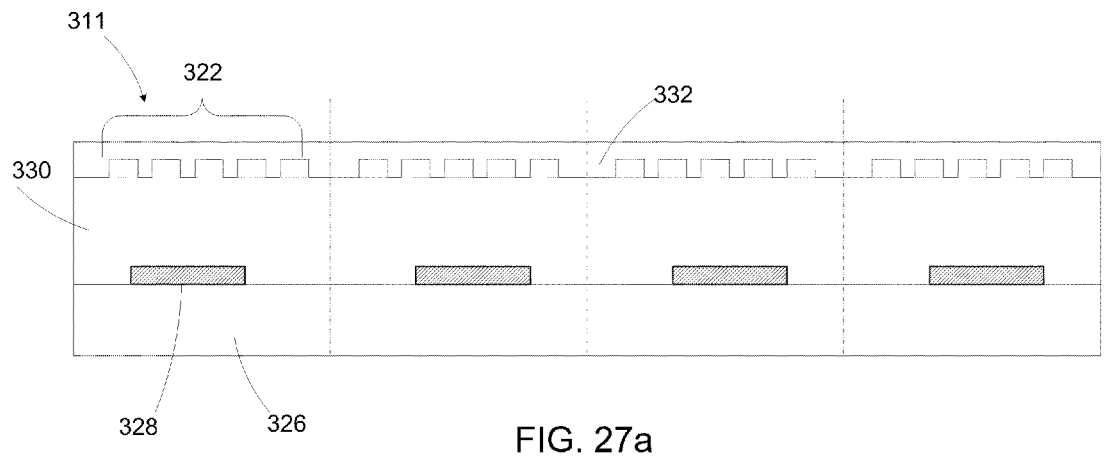
FIG. 27a, FIG. 27b, FIG. 28, FIG. 29a, 29b and FIG. 30 are cross-sectional views of exemplary embodiments.

Referring to FIG. 27a, semiconductor substrate 326 comprises multiple die areas, such as die area 311. Internal circuits, such as 328, are formed in the die area (e.g. 311) on semiconductor substrate 326. Conductive lines, such as 322, are formed on dielectric layer 330 that is deposited on the internal circuits (328) and the semiconductor substrate (326). The conductive lines (e.g. 322) can be formed by, for example, depositing one or more conductive materials (e.g. a metallic material or a combination of conductive materials or multiple conductive layers) followed by patterning, wherein the deposition can be performed by sputtering, CVD, electroplating, or many other possible techniques. Insulating layer 332, which can be a passivation layer, is deposited on the conductive lines (e.g. 322).

Figure 27B:
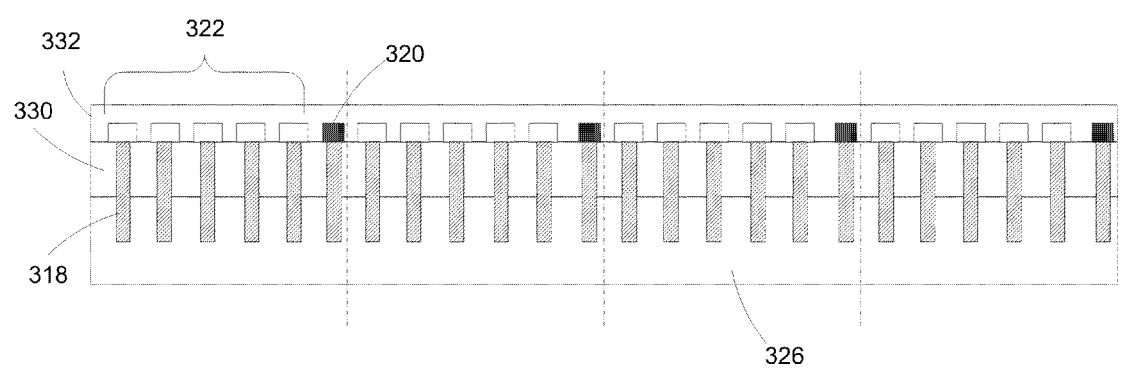

FIG. 27b is a cross-sectional view taken along the line BB' in FIG. 21. TSVs, such as TSV 318 are formed, which span across the vertical dimension (thickness) of the dielectric layer (330) and into the semiconductor substrate (326). The TSVs are electrically connected to the conductive lines (322) and the lower die pads (e.g. 320).

During the fabrication of the lower wafer, redistribution within the chip (e.g. the internal circuit) for signals to the pad may be performed. A passivation layer (e.g. insulating layer 332) can be applied across the finished chip once the lower chip pads (e.g. 320) are formed. The passivation layer (e.g. 332) allows the lower wafer to be removed from the chip processing facility if desired, such as being exposed to atmosphere. Then a further redistribution is applied at the packaging facility. The passivation layer (e.g. 332) is opened up to connect a redistribution layer to connect the pads to the terminals (e.g. balls/bumps). This allows a separate manufacturing facility (e.g. a chip making facility) to make wafers containing the chips and a separate manufacturing facility (e.g. packaging facility) to package the chips, as well as allows the same chip design to be used in multiple different packages.

Moreover, in chip making, there are often restrictions as to where the chip pads can be placed. For example, chip pads are sometimes restricted from being placed over a particular device forming region (for example, restricted from being placed over memory cells in NAND flash memory or restricted from being placed over a peripheral circuit region or portions thereof). However, the package bumps do not have such restrictions, and thus can take advantage of the extra area to provide further spacing between bumps. The bumps do not have the restrictions that the pads do because there is a cushion layer.

Figure 28:
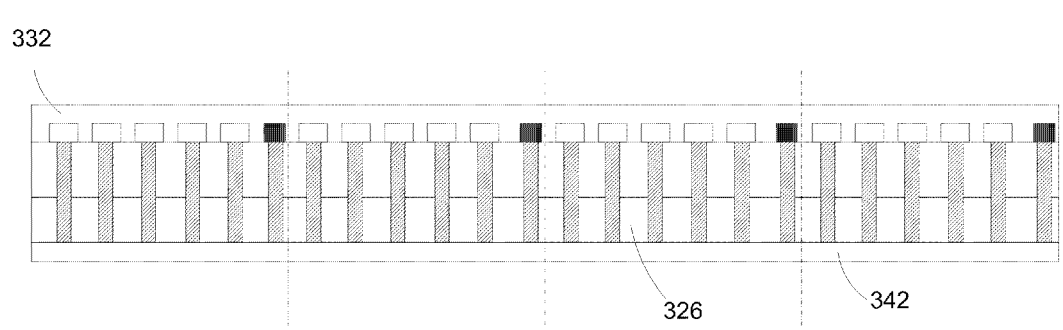

The finished lower semiconductor wafer having fabricated chips and conductive lines can be transferred to a packaging process for packaging. Referring back to FIG. 26, the backside of the lower semiconductor wafer is processed (step 352) so as to expose the TSVs, for example, by grinding or other suitable methods. This process step is illustrated in the cross-sectional view in FIG. 28. The backside of the semiconductor substrate 326 is processed (e.g. by grinding); and at least a portion of each TSV is exposed thereby. The backside insulating layer 342 can be applied.

Figure 29A:
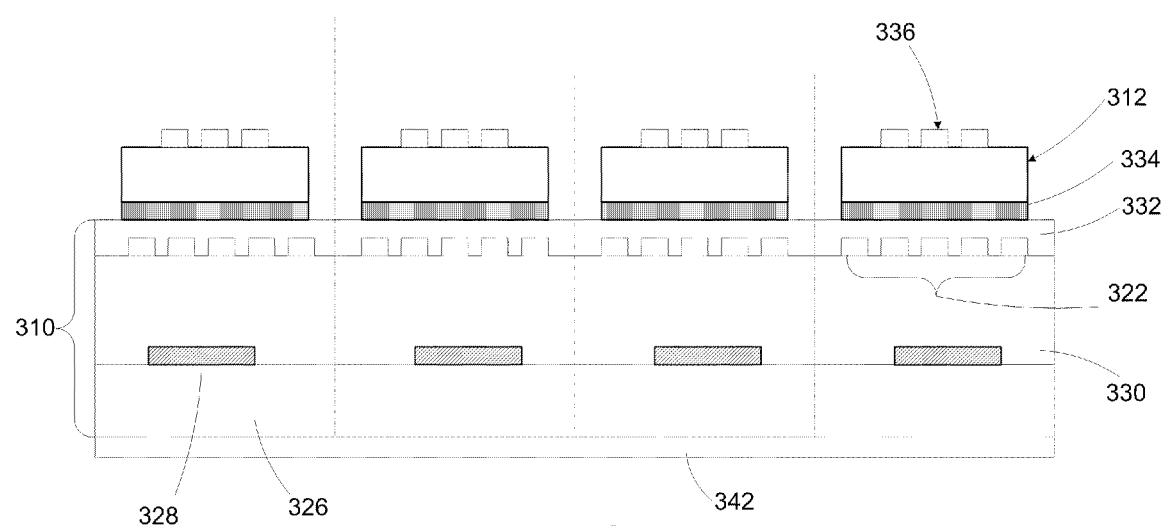

Referring back to FIG. 26, the second chips can be mounted on the lower semiconductor wafer (step 354) after processing the backside of the lower semiconductor wafer, which is better illustrated in FIG. 29a.

Referring to FIG. 29a, the second chips, such as the second chip 312, having chip pads (336), are mounted on the passivation layer (332). Adhesive 334 can be used to secure the position of the second chips on the insulating layer 332.

Figure 29B:
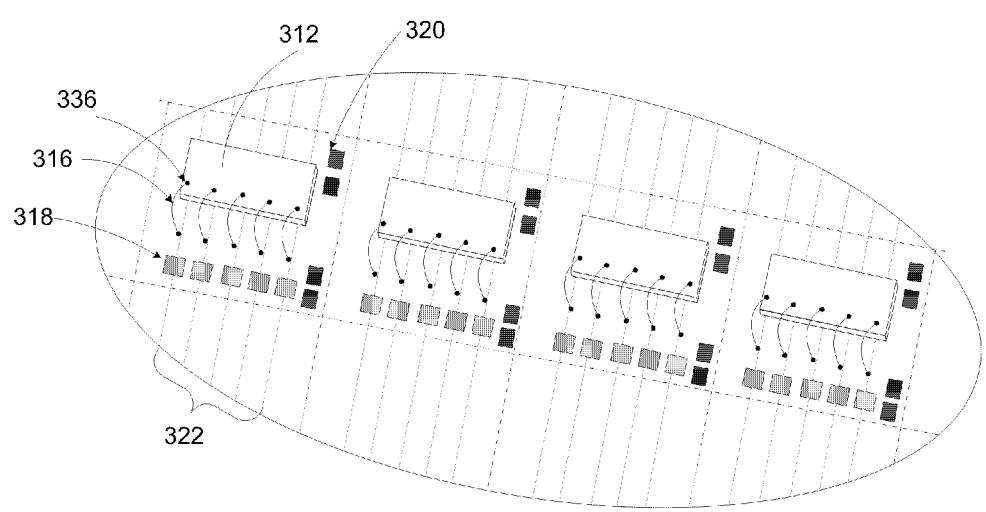

Referring back to FIG. 26, the chip pads of the second chips can be electrically connected to the conductive lines, as diagrammatically illustrated in FIG. 29b. Referring to FIG. 29b, a portion of the lower semiconductor wafer is diagrammatically illustrated for simplicity. The chip pads, for example, of upper chip 312 are electrically connected to conductive lines 322. The conductive lines are electrically connected to the corresponding TSVs of the lower semiconductor wafer.

Figure 30:
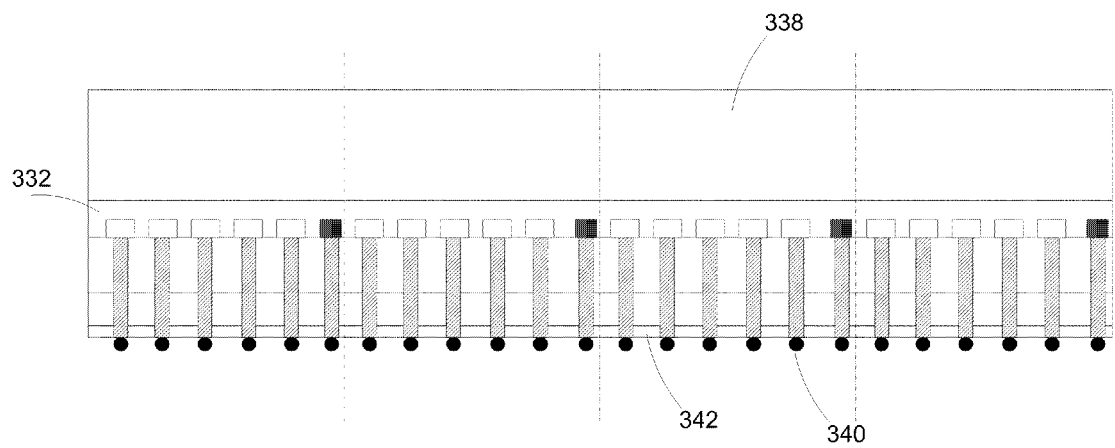

Referring back to FIG. 26, the stack can be encapsulated (step 358), which is schematically illustrated in a cross-sectional view in FIG. 30, wherein encapsulation layer 338 is deposited on the upper chips.

Solder balls or other possible electrical connections can be attached to the exposed TSVs at the backside of the semiconductor wafer (step 360).

The semiconductor wafer can then be singulated (step 362) so as to obtain individual devices. For example, the fabricated semiconductor wafer with the second chips and desired electrical connections can be sawed along the saw lines by, for example, laser or other types of techniques.

Other than forming the conductive lines at the chip making process as discussed above with reference to FIG. 26, the conductive lines can be fabricated at a packaging process. As a way of example for making MCPs as illustrated in FIG. 23a and FIG. 23b, the lower semiconductor wafer 310 can be fabricated in a chip making process, e.g. at a chip making facility. Specifically, the semiconductor substrate 326 is provided, internal circuits (e.g. 328) are formed in the die areas of the semiconductor substrate (326), and the insulating layer 332 (which can be a passivation layer) is formed. The lower chip pads (e.g. 320) and the TSVs to be connected to the lower chip pads are formed. The TSVs to be connected to the conductive lines (not formed yet), in one example, can be formed in the chip making process; and in another example, can be formed afterwards in the packaging process.

The fabricated lower semiconductor wafer can be transferred to a packaging process (e.g. a packaging facility). In the packaging process, the conductive lines (e.g. 322) are formed on the insulating layer 332, which is a passivation layer. Resin layer 333 can then be applied on the conductive lines. In the instance wherein the TSVs to be connected to the conductive lines are not fabricated in the chip making process, those TSVs (e.g. 318) can be formed and electrically connected to the conductive lines. Not necessarily in the order, the second chips (e.g. 312) can be mounted with or without the adhesive layer (e.g. 334). The backside of the semiconductor substrate (326) can be processed (e.g. grinded) so as to open at least a portion of each TSV. The opened ends of the TSVs can be attached thereto terminals, such as balls/bumps; and the backside insulating layer 342 can be applied.

The entire wafer can then be encapsulated by encapsulating layer 338; and the finished MCP portions can be singulated from the wafer so as to obtain individual MCPs.

Figure 31A:
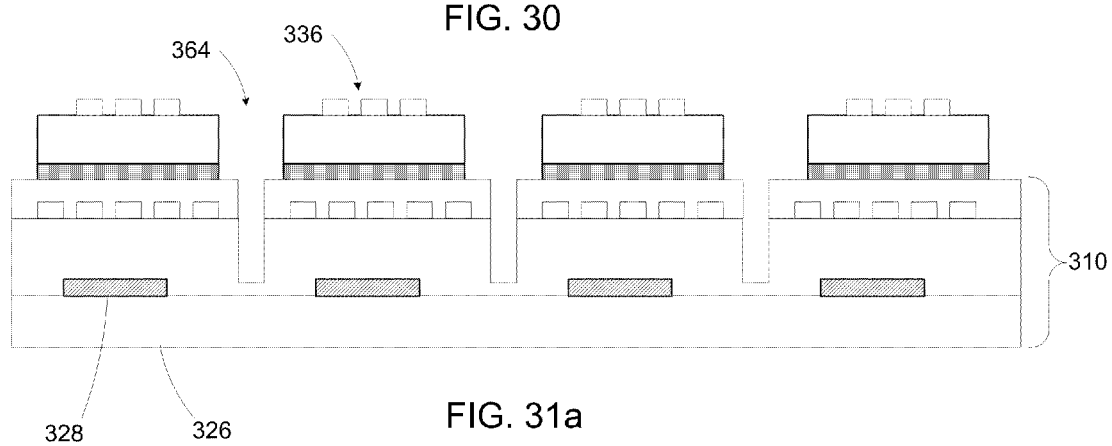
FIG. 31a and FIG. 31b are views of MCP portions on a wafer before singulation during another exemplary fabrication process.
Figure 31B:
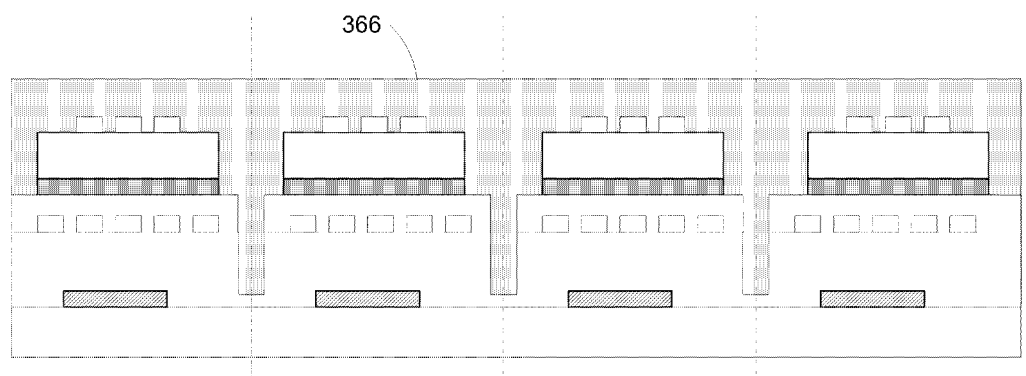

The encapsulation process can be accomplished alternatively by half-sawing, as diagrammatically illustrated in FIG. 31a and FIG. 31b. Referring to FIG. 31a, the lower semiconductor wafer 310 can be half-sawed leaving a trench after the deposition of the passivation layer (after or before mounting the second chips). Encapsulation layer 366 can be deposited after the steps of mounting the second chips and connecting the chips pads of the second chips, as diagrammatically illustrated in FIG. 31b. The deposited encapsulation material fills the trenches left by the half-sawing and substantially covers the second chips and the trenches. As a consequence, the major sidewalls of the MCP devices can also be protected by the encapsulation layer after the singulation.

It is noted the above are only selected examples. Other variations are also applicable. For example, the conductive lines can be formed before, after, or concurrently with the pads of the lower semiconductor wafer (e.g. die pads 320 in FIG. 22b). For example, when insulating layer 332 is a passivation layer, the die pads 320 may be formed under the passivation layer and the conductive lines 322 may be formed on the passivation layer. The fabrication of lower semiconductor wafer and the mounting of the second chips can be performed at the same or different processes and in the same or different facilities. For example, the lower semiconductor wafer may be produced at one manufacturing facility and shipped to a packaging facility for packaging multiple chips in a multi-chip package. The wafer may be singulated or separated into several chips or dies prior to mounting a second chip on each of the singulated chips (and combining additional chips, depending on the application), and the combination packaged.

The TSVs can be fabricated at the chip making facility or at the packaging manufacture. TSVs can be via first TSV fabricated by chip manufactures or can be via last.

Alternatively, the additional chips may be mounted at the wafer level. That is, wafer level packaging may be accomplished by mounting the second chips (and possibly other chips) to corresponding dies integral with each other, and the combined sets of chips packaged together. The combined sets of chips may then be separated (e.g., singulated) into individual stand alone multi-chip packages. The dies which are integral with each other may be embodied by an entire wafer (e.g. a 200 mm or 8 inch wafer, a 300 mm or 12 inch wafer, or a 450 mm or 18 inch wafer), or a portion thereof.

Figure 32:
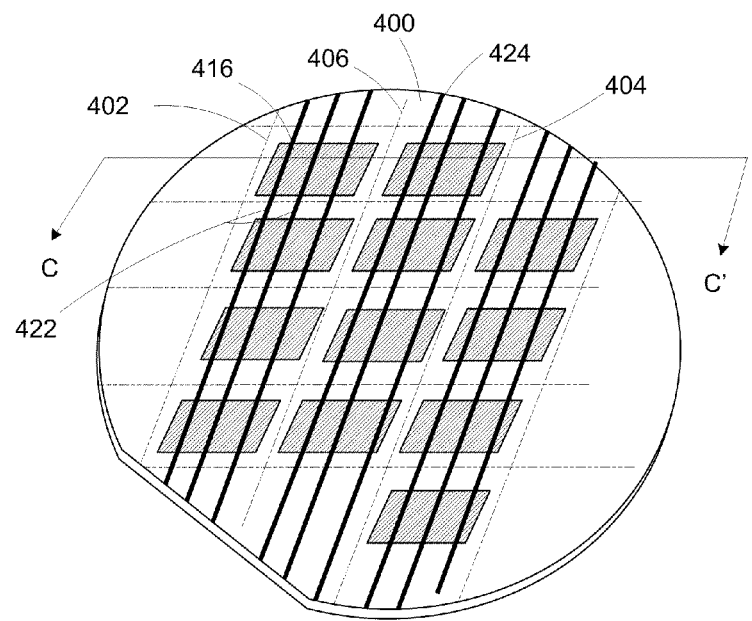
FIG. 32 is a perspective view of a semiconductor wafer having formed thereon another exemplary MCP portions before singulation.

FIG. 32 diagrammatically illustrates an exemplary wafer having semiconductor devices, wherein the semiconductor devices comprise conductive lines. Referring to FIG. 32, wafer 400 comprises die areas, such as die areas 402 and 404. Lines 406 denote separation lines along which the dies will be separated from each other into individual chips, such as those chips previously described or variations thereof. Thus, in each die area, a semiconductor device having conductive lines 422, 424 can be formed, such as any one of the above described embodiments or variations thereof. In this example, the conductive lines 422, 424 are illustrated to be linear, parallel, spaced apart at constant pitch and extend across the entire die (i.e., from one separation line to another, corresponding to one edge to another edge of the chip after singulation). However, the conductive lines 422, 424 may take other patterns and forms, including any of those described previously and variations thereof. For example, as shown afterwards in FIG. 39, the conductive lines may be formed to be discontinuous at the center of a die area to facilitate the chip configuration.

Figure 33:
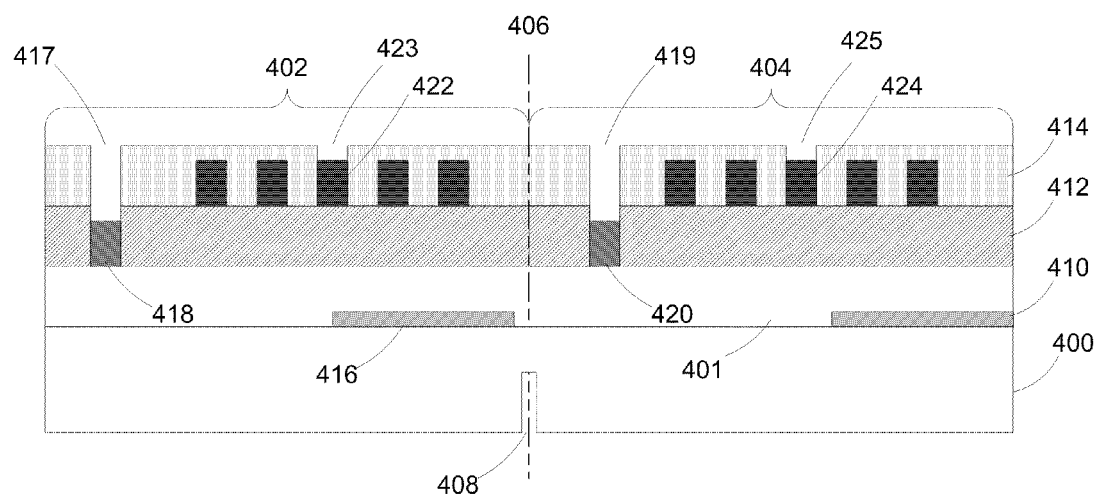
FIG. 33 is a cross-sectional view taken along line CC' in FIG. 32.

As an example, a cross sectional view along the CC' direction that spans across die areas 402 and 404 is diagrammatically illustrated in FIG. 33. Such die areas 402 and 404 are eventually separated from each other and may each correspond to the chip 356 illustrated and described previously with respect to FIG. 21.

Referring to FIG. 33, wafer 400 is provided. A notch or score 408 may be formed along separation lines 406 in wafer 400 to facilitate separation of the dies into discrete chips. Internal electronic circuits are formed in the semiconductor wafer 400 and in individual die areas. For example, circuits 416 and 410 are respectively formed in die areas 402 and 404 and in wafer 400.

Dielectric layer 401 is deposited, for example, by a standard thin-film deposition technique, on the internal circuits and wafer 400. Chips pads, such as chip pads 418 and 420 are formed on dielectric layer 401. The chip pads can be formed in many ways, such as depositing a selected conductive material followed by patterning. The chip pads are electrically connected to the corresponding internal circuits. Specifically, the chip pads in a die area are electrically connected to the internal circuit located at the same die area. For example, chip pad 418 in die area 402 is electrically connected to circuit 416 positioned in the same die area 402; and chip pad 420 in die area 404 is electrically connected to circuit 410 positioned in die area 404. The chip pads may be used to provide power to its corresponding circuit, provide input signals to its corresponding circuit and/or provide output signals from its corresponding circuit. It is preferred that chip pads in different die areas are separate, e.g. not connected.

Passivation layer 412 is formed on dielectric layer 401 and the chip pads. In one example, a selected material of the passivation layer is deposited, by for example, a standard thin-film deposition technique. The deposited passivation layer is patterned so as to form openings, such as openings 417 and 419, for exposing at least a portion of each chip pads. The patterning can be performed by a standard lithographic technique and a suitable etching process.

Conductive lines, such as conductive lines 422 and 424, are formed on the passivation layer. The conductive lines can be formed by, for example, depositing a selected conductive material on the passivation layer followed by patterning. The formed conductive lines are isolated from the internal circuits formed on the wafer 400. Without further external connections, the conductive lines 422, 424 are electrically floating. In one example, the conductive lines are isolated from substantially all internal circuits in each or all die areas of the wafer. Therefore, without some further circuitry or modification, during operation, the power, ground or electronic signals carried by the conductive lines of a die area are not transmitted to the internal circuit(s) located below these conductive lines or otherwise in the same die area.

Insulation layer 414 is formed on the conductive lines and passivation layer 412. The insulation layer (114) comprises openings, such as openings 423, 425, 417, and 419, which expose portions of the chip pads and selected conductive lines (e.g. conductive lines to be used for electrical connection). The insulation layer can be formed in many ways. For example, a resin layer can be deposited on the conductive lines and passivation layer 412.

Then, the wafer can be singulated to obtain individual semiconductor chips 402 and 404, such as those chips set forth in the above described embodiments. The die areas may be separated from the wafer along the separation lines if provided to produce the corresponding chips.

The deposited resin layer 414 and/or insulation layer 412 may be patterned before or after singulation so as to obtain the desired openings. A method for making the semiconductor devices may include the following steps:
(a) provide a semiconductor wafer;
(b) form circuits in and/or on the semiconductor wafer (e.g., logic circuitry including transistors, logic gates (NOR, NAND, inverters, etc.) to form a memory device, controller, DSP, microprocessor, etc.) at multiple die areas;
(c) form chip pads in the multiple die areas connected to the circuits to provide power and/or ground to respective ones of the circuits and signal communications with respective circuits;
(d) form a passivation layer over the wafer;
(e) form isolated and/or floating conductive lines across the multiple die areas, which are not in electrical communication with the circuits;
(f) form an insulation layer on the passivation layer.
(g) singulating the wafer with the circuits, chip pads and conductive lines to form individual chips with respective circuits, chip pads and conductive lines; and
(h) provide access to the chip pads and/or conductive lines as desired (for example, by providing an opening in the passivation layer);

The order need not be as set forth above. For example, access to conductive lines and/or chip pads may be done prior to singulation. Also, the conductive lines may be formed prior to or simultaneously with the formation of the chip pads.

Figure 34:
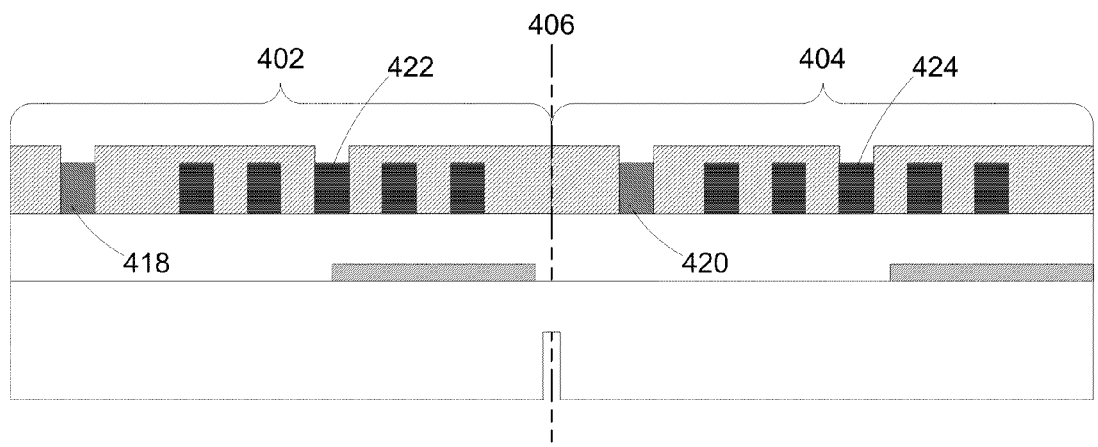
FIG. 34 is a cross-sectional view of a portion of yet another exemplary MCP portions.

Various semiconductor devices having conductive lines can be formed in the die areas of wafer illustrated in FIG. 21, another example of which is diagrammatically illustrated in FIG. 34. Referring to FIG. 34, different from that illustrated in FIG. 33, the conductive lines and chip pads may be formed in the same level, such as on the passivation layer. The individual chips 402 and 404 in FIG. 34 may each correspond to a chip of wafer 311 illustrated by and described above with respect to FIG. 21.

The conductive lines are especially useful in device assemblies having multiple semiconductor devices. Specifically, a number of conductive lines may be provided on the lower chip which exceeds the number of chip pads of a second chip and a third chip, only one of which is to be mounted on the lower chip. Therefore, the lower chip may be designed with minimal concern for later packaging requirements and the packaging design (e.g., an MCP package comprising the lower chip and a second chip, or a different MCP package design comprising the lower chip and the third chip having different pad layout) may still be flexible due to the number of conductive lines provided.

Figure 35:
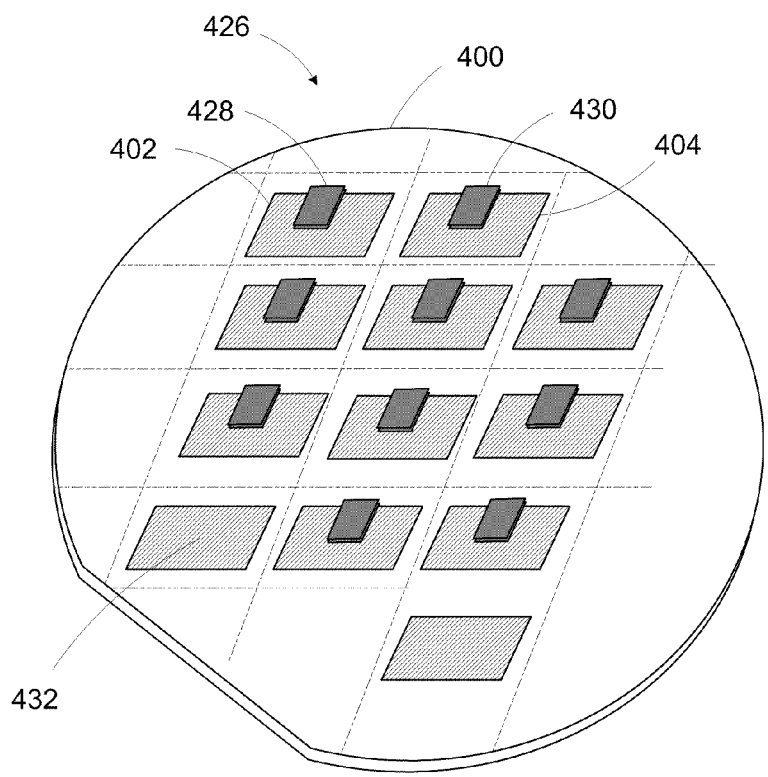
FIG. 35 is a perspective view of a semiconductor wafer having formed thereon yet another exemplary MCP portions before singulation.

As another example, the assembly can be on the wafer level as diagrammatically illustrated in FIG. 35. Referring to FIG. 35, multiple semiconductor devices (or other type of electronic devices), such as devices 428 and 430, are assembled to the semiconductor devices in the die areas, such as the semiconductor devices in die areas 402 and 404. Before the assembling, the formed semiconductor devices on wafer 400 can be inspected according to a predetermined criterion. Those semiconductor devices, such as devices 432, fail the inspection may not be assembled. The wafer assembly (426) can then be covered in a protective material (e.g., a resin) and then singulated to obtain individual device assemblies.

Figure 36:
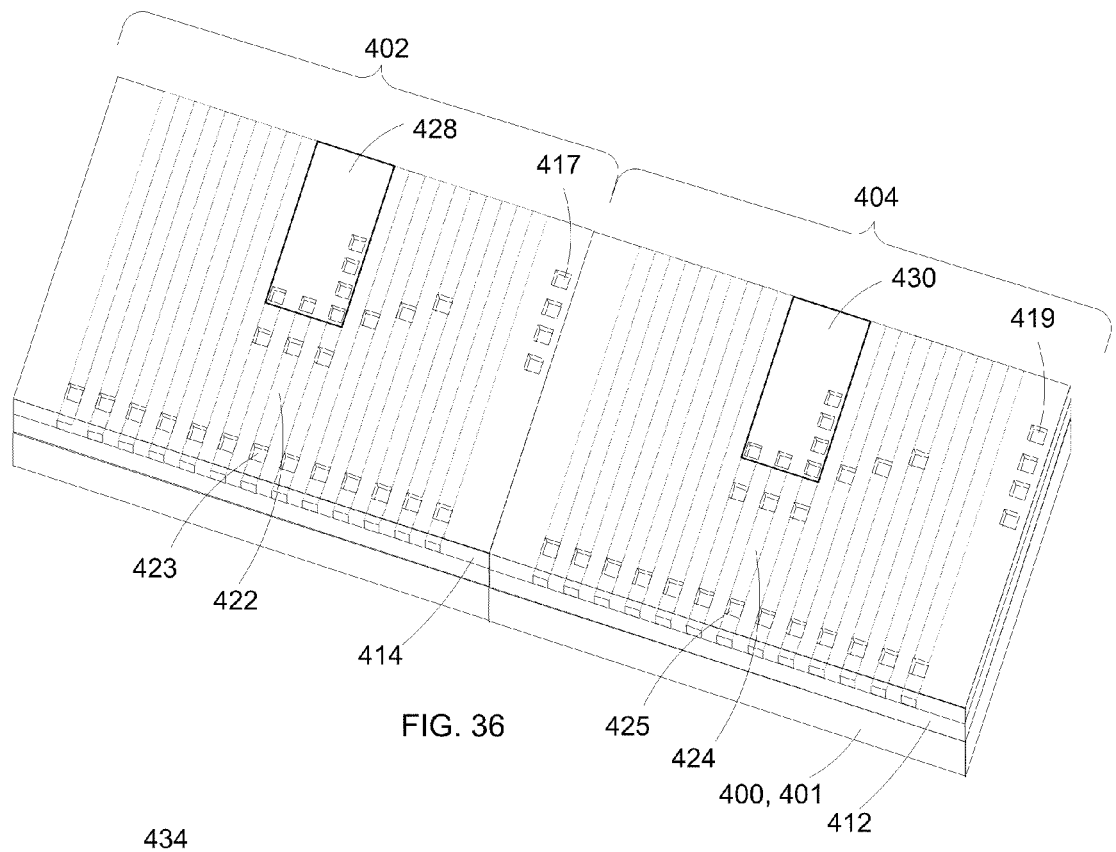
FIG. 36 and FIG. 37 are perspective views of the MCP portions in FIG. 35.
Figure 37:
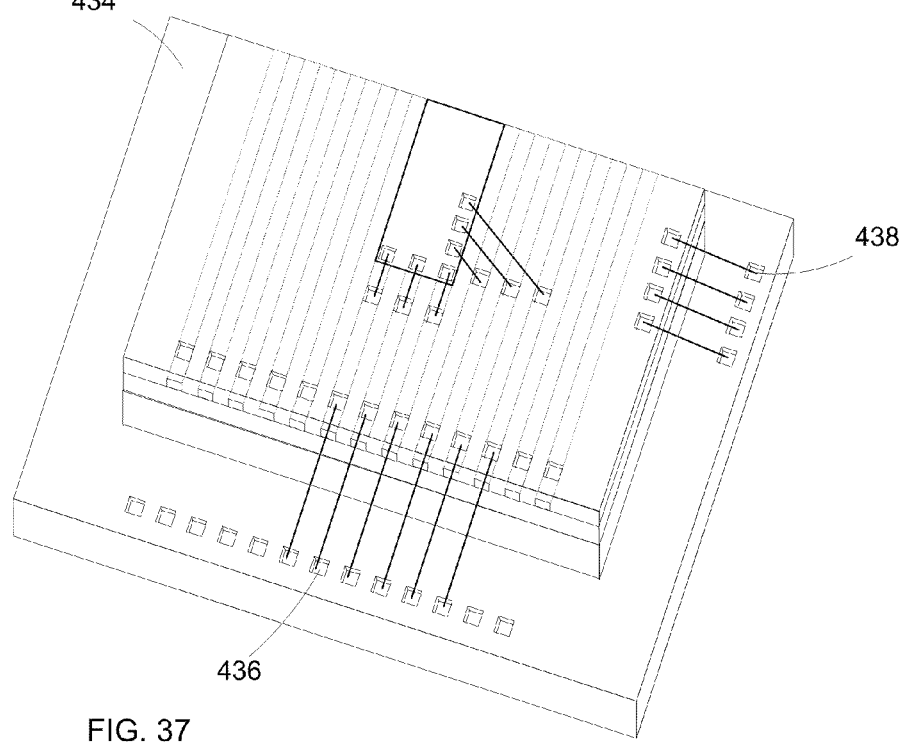

FIG. 36 and FIG. 37 diagrammatically illustrate an exemplary wafer assembly before and after singulation. Referring to FIG. 36, die areas 402 and 404 are shown for demonstration purposes. In each die area, a semiconductor device is formed, wherein the semiconductor device comprises chip pads (e.g. chip pad 418 under opening 417 in die area 402, and chip pad 420 under opening 419 in die area 404) and conductive lines (e.g. conductive line 422 in die area 402, and conductive line 424 in die area 404). Portions of the conductive lines to be used for electrical connection are exposed by openings. For example, conductive lines 422 and 424 to be used for connecting to devices 428 and 430 are partially exposed by openings 423 and 425.

Electrical connections of the conductive lines to the assembled devices (e.g. 428 and 430) can be performed before singulating the wafer or after singulating the wafer. Specifically, before singulating the wafer, selected conductive lines of a semiconductor device in a die area can be connected to the device assembled to the semiconductor device, through, for example, wire bonding. After the forming of electrical connection, the wafer can be singulated. In another example, the wafer can be singulated prior to providing the desired electrical connection of conductive lines to the individual device assemblies.

Referring to FIG. 37, singulated device assembly comprising assembled multiple devices (e.g. the semiconductor chip 402 and chip 428 as illustrated in FIG. 36) is positioned on package substrate 434. Electrical connection of the selected conductive lines and chip pads can be completed at this time. Then the entire assembly may be covered with a protective material, such as encapsulation with a resin.

Figure 38:
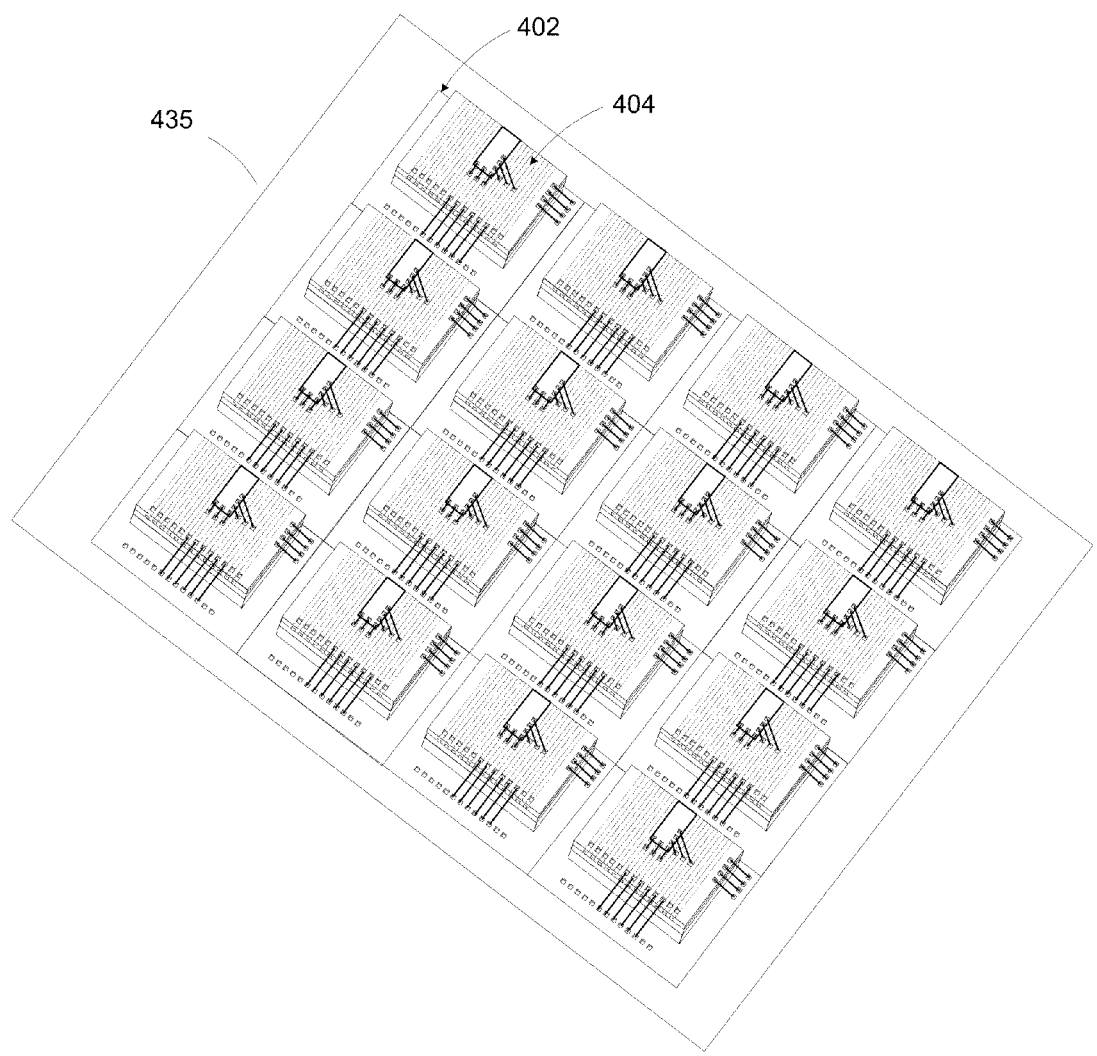
FIG. 38 is a perspective view of a semiconductor wafer having formed thereon yet exemplary MCP portions before singulation.

The MCP can also be fabricated on the wafer level packaging, an example of which is diagrammatically illustrated in FIG. 38. Referring to FIG. 38, element 435 is a wafer having die areas. Each die area has formed therein terminals for electrical connection to the chip pads and conductive lines. However, the conductive lines can be formed by, for example, depositing a conductive material (e.g. a metallic material) followed by patterning, wherein the deposition can be performed by sputtering, CVD, electroplating, or many other possible techniques during the packaging process. Specifically, the conductive lines can be fabricated by a packaging manufacture before mounting the second semiconductor chips.

The desired electrical connections can be completed thereafter, for example, before or after the singulation of the wafer. In the example as illustrated in FIG. 38, individual device assemblies (e.g., second chips) are placed on the die areas and the electrical connection for the chip pads and/or conductive lines can be performed. In another example, all electrical connection of the chip pads and the selected conductive lines in each device assembly can be performed followed by singulation of the wafer. The semiconductor wafer (402) can be the same as that discussed above with reference to FIG. 21. In another example, the semiconductor substrate (e.g. substrate 326 in FIG. 22*a*) can be directly used as the packaging wafer.

An exemplary wafer level packaging method may comprise the steps of: 1) preparing a semiconductor substrate having a device formed therein; 2) forming an electrical connection on the semiconductor substrate to connect the device to an external terminal; 3) encapsulating the semiconductor substrate by encapsulation material; 4) singulating the semiconductor substrate to individual device assembles. Steps 3) and 4) can be exchanged in other examples. If the electrical connection is a solder ball or the like, the solder ball can be formed on one surface of the semiconductor substrate; and the encapsulation material can be formed on the other surface of the semiconductor substrate before or after singulation. If the electrical connection is a wire or the like, the wire can be disposed to one surface of the semiconductor substrate and the encapsulation material can be formed on the one surface (same surface on which the wire is disposed) of the semiconductor substrate. The wire forming step and the encapsulating step can be proceeded before or after the singulation step.

Figure 39:
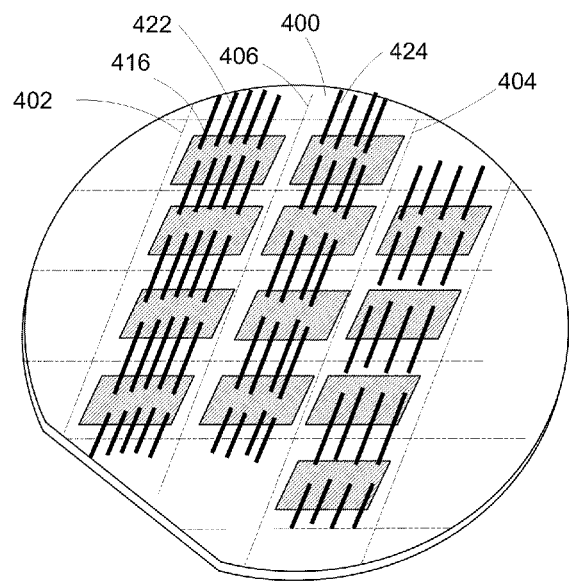
FIG. 39 is a perspective view of a semiconductor wafer having formed thereon yet another exemplary MCP portions before singulation.

FIG. 39 diagrammatically illustrates yet another exemplary MCP having conductive lines one a wafer before singulation. In this example, conductive lines, such as conductive lines 422 are discontinuous within the wafer, in particular, discontinuous within the area wherein the second chips are disposed. However, the gap between two adjacent segments of each conductive line is substantially equal to or less than the dimension of the second chip along the length of the conductive line.

Figure 40:
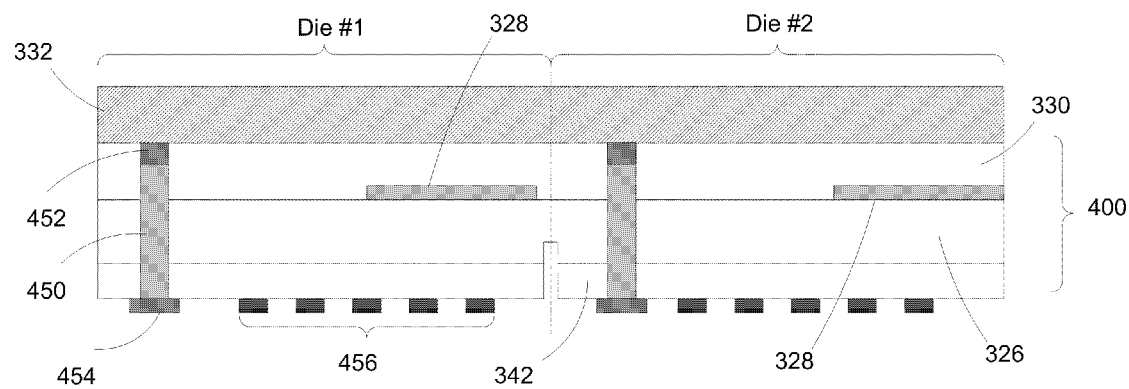
FIG. 40 is a cross-sectional view of MCP portions implemented therein another exemplary electrical connection scheme.

Conductive lines can alternatively be formed on the backside of the semiconductor wafer, an example of which is diagrammatically illustrated in FIG. 40. Referring to FIG. 40, lower wafer 400 comprises semiconductor substrate 326 on which an internal circuit is formed. Dielectric layer 330 is deposited on the internal circuits. Lower wafer pads, such as pad 452, are connected to terminals, such as terminal 454, which are located at the backside of the semiconductor wafer through TSVs, such as TSV 450. Conductive lines, such as 456, are formed on the backside of the semiconductor substrate 326. The second chips can be disposed on the backside of the semiconductor substrate (326), using the conductive lines (456) for electrical connection. Conductive lines 456 may correspond to lines 322 or 422, for example, and be isolated from internal circuits 328 formed within wafer 400 and be used in a similar manner as conductive lines 422 (e.g., for connections between a second chip and package terminals of the MCP). Alternatively, the conductive lines can be connected to TSVs (not shown in the figure) for connecting the second chips that are disposed above the dielectric layer.

Figure 41:
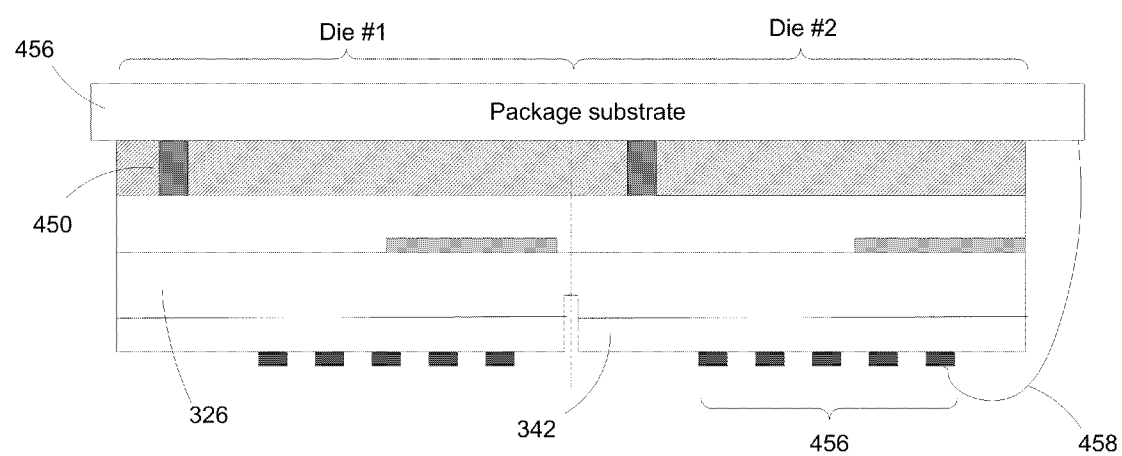
FIG. 41 is a cross-sectional view of MCP portions implemented therein another exemplary electrical connection scheme.

Yet another exemplary electrical connection scheme is diagrammatically illustrated in FIG. 41. Referring to FIG. 41, conductive lines, such as conductive lines 456 are formed on the backside of semiconductor substrate 326; while the internal circuits are formed on the opposite side of the semiconductor substrate. Lower wafer pads, such as pad 450, can be used for electrically connecting the internal circuit to the terminals deployed on the package substrate (456) that is disposed above the internal circuits and the dielectric layer. The conductive lines 456 can be connected to the package substrate, through, for example, wires, such as wire 458. Conductive lines 456 may correspond to lines 322 or 422, for example, and be isolated from internal circuits formed within wafer 400 and be used in a similar manner (e.g., for connections between a second chip and package terminals of the MCP).

Multiple variations of the above examples will readily be apparent to one of ordinary skill and are intended to also fall within the scope of this invention, as set forth in the claims. For example, variations of the individual packages, individual package elements and individual chips, may be generated by the processes and used as part of the wafers described elsewhere in this disclosure. For example, the variation of the example of FIG. 4 (as compared to FIG. 3) may be considered reflected by the example of FIG. 23*b*. However, it is equally contemplated that the one or more of the variations reflected in the examples associated with FIGS. 5-18 may be implemented with the examples associated with FIGS. 21, 22*a* and 22*b* for example. Similarly, it is equally contemplated that the one or more of the variations reflected in the examples associated with FIGS. 5-18 may be implemented with the examples associated with FIGS. 22*d* and 22*e*, and/or the example of FIGS. 23*a* and 23*b*, and/or with the example of FIG. 24, etc. Similarly, any of the packages or package elements described (associated with a single figure, or by way of a combination), may be used within either of the systems associated with FIGS. 19 and 20. The above specified combinations are given for illustrative purposes and are not considered exhaustive; the possible combinations of the individual features of the examples set forth in this disclosure will be apparent to one ordinary skill and listing each possible combination here, while within the scope of the invention, is not considered necessary.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments. Furthermore, for ease of understanding, certain method procedures may have been delineated as separate procedures; however, these separately delineated procedures should not be construed as necessarily order dependent in their performance. That is, some procedures may be able to be performed in an alternative ordering, simultaneously, etc. In addition, exemplary diagrams illustrate various methods in accordance with embodiments of the present disclosure. Such exemplary method embodiments are described herein using and can be applied to corresponding apparatus embodiments, however, the method embodiments are not intended to be limited thereby.

Although few embodiments have been illustrated and described, it would be appreciated by those skilled in the art that changes may be made in these embodiments without departing from the principles and spirit of the invention. The foregoing embodiments are therefore to be considered in all respects illustrative rather than limiting on the invention described herein. Scope of the invention is thus indicated by the appended claims rather than by the foregoing description, and all changes which come within the meaning and range of equivalency of the claims are intended to be embraced therein. As used in this disclosure, the term "preferably" is non-exclusive and means "preferably, but not limited to." Terms in the claims should be given their broadest interpretation consistent with the general inventive concept as set forth in this description. For example, the terms "coupled" and "connect" (and derivations thereof) are used to connote both direct and indirect connections/couplings. As another example, "having" and "including", derivatives thereof and similar transitional terms or phrases are used synonymously with "comprising" (i.e., all are considered "open ended" terms)—only the phrases "consisting of" and "consisting essentially of" should be considered as "close ended". Claims are not intended to be interpreted under 112 sixth paragraph unless the phrase "means for" and an associated function appear in a claim and the claim fails to recite sufficient structure to perform such function.

What is claimed is:

1. A method of processing a wafer comprising:
providing a semiconductor substrate;
forming circuitry in a first die area of the semiconductor substrate consisting essentially of a first circuit and circuitry in a second die area of the semiconductor substrate consisting essentially of a second circuit;
forming first pads in electrical communication with the first circuit and second pads in electrical communication with the second circuit; and
after forming the first and second circuits, forming conductive lines at least portions of which are within the boundaries of the first and second die areas, the conductive lines being substantially electrically isolated from the first and second circuits.

2. The method of claim 1, further comprising:
after forming the conductive lines, separating the first die area from the second die area to form first and second semiconductor chips respectively corresponding to the first and second die areas.

3. The method of claim 1, wherein the step of forming conductive lines comprises:
depositing a conductive layer comprised of an electrically conductive material; and
patterning the conductive layer so as to obtain the conductive lines.

4. The method of claim 3, wherein the conductive layer is deposited by an electroplating technique.

5. The method of claim 3, further comprising:
after forming the first pads and second pads and before forming the conductive lines, exposing the semiconductor substrate to the atmosphere.

6. The method of claim 2, after forming the conductive lines and prior to separating the first die area from the second die area, further comprising the following steps:
mounting second chips on the first and second die areas;
connecting the second chips to the conductive lines in the first and second die areas; and
encapsulating the second chips.

7. The method of claim 2, further comprising, after forming the conductive lines and prior to separating the first die area from the second die area:
depositing a passivation layer on the conductive lines; and
exposing the semiconductor substrate to air.

8. The method of claim 7, after forming the conductive lines and prior to separating the first die area from the second die area, further comprising the following steps:
mounting second chips on the first and second die areas;
connecting the second chips to the die pads of the first and second die areas; and
encapsulating the second chips.

9. The method of claim 7, wherein the passivation layer is composed of a polymer.

10. The method of claim 1, comprising:
forming a plurality of through-silicon-vias in the first and second die areas such that the through-silicon-vias are connected to the conductive lines and first and second pads in the first and second die areas.

11. The method of claim 10, further comprising:
attaching a solder ball to a backside of the wafer in electrical communication with at least one of the through-silicon-via.

12. The method of claim 11, further comprising:
wherein the semiconductor substrate is a first semiconductor;
providing a second semiconductor substrate having a plurality of die areas and an internal circuit formed in each die area;
mating the first and second semiconductor substrates; and
singulating the mated first and second semiconductor substrates.

13. The method of claim 1, wherein the semiconductor substrate is a silicon wafer.

14. The method of claim 1, wherein the pads and conductive lines are formed during the same process.

15. The method of claim 1, wherein the conductive lines are formed after forming the first and second pads.

16. The method of claim 2, wherein immediately after forming the first and second semiconductor chips, the conductive lines are electrically floating with respect to the remainder of the first and second semiconductor chips.

17. A method of manufacturing, comprising:
providing a wafer comprising a substrate, a first circuit formed at least one of on and within the substrate, and first conductors substantially electrically isolated from the first circuit; and
singulating at least a first chip from the wafer, the first chip comprising circuitry and at least a portion of the first conductors, the circuitry of the first chip consisting essentially of the first circuit.

18. The method of claim 17, further comprising:
combining the first chip with a second chip in a multi-chip package; and
creating an electrical connection of a pad of the second chip to a first conductor of the first chip, and creating an electrical connection the first conductor electrically connected to the pad of the second chip to a terminal of the multi-chip package.

19. The method of claim 17, wherein the substrate is a semiconductor substrate and the first circuit is formed both within and on the semiconductor substrate.

20. A method of manufacturing comprising:
combining a first chip with a second chip in a multi-chip package, the first chip including a first circuit and a first conductor, the second chip including a second circuit; and
creating an electrical connection of a pad of the second chip to the first conductor of the first chip, and creating an electrical connection of the first conductor to a terminal of the multi-chip package,
wherein within the first chip, there are no power, ground or signal connections between the first conductor and all internal circuitry of the first chip.

21. A method, comprising:
providing a semiconductor device wafer having a plurality of die areas, each die area including a circuit and die pads connected to the corresponding circuit, the semiconductor wafer including a passivation layer deposited over the plurality of die areas and corresponding circuits, the passivation layer having openings to expose the die pads;
forming a plurality of conductive lines on the passivation layer such that the conductive lines in each die area are logically isolated from the circuit located in said each die area; and
separating the die areas from the device wafer so as to obtain individual semiconductor devices after forming the conductive lines.

22. The method of claim 21, further comprising:
forming a insulation layer, comprising:
depositing a resin layer on the conductive lines and the passivation layer; and patterning the resin layer such that, in said die area, at least a portion of said chip pad is exposed; and at least a portion of a conductive line in said die area is exposed.

23. The method of claim 22, further comprising:
providing a second chip having a second circuit on the insulating layer in said die area; and
connecting the second circuit to said exposed portion of the conductive line.

24. The method of claim 22, wherein the second chip is provided before the step of separating the die areas into individual devices.

25. The method of claim 24, wherein the second chip is provided after the step of separating the die areas into individual devices.

26. The method of claim 22 further comprising:
providing a package substrate having first and second terminals; and
wire bonding said chip pad to the first terminal and said conductive line to the second terminal.

27. A method of manufacturing, comprising:
depositing a metal layer on a semiconductor wafer, the semiconductor wafer having at least substantially completed internal circuitry; and
patterning the metal layer to provide conductive patterns which are electrically isolated from the internal circuitry;
then singulating the semiconductor wafer with the conductive patterns electrically isolated from the internal circuitry,
wherein the conductive patterns comprise a plurality of conductive traces extending over the internal circuitry.

* * * * *